United States Patent [19]

Kato et al.

[11] Patent Number: 5,640,227

[45] Date of Patent: Jun. 17, 1997

[54] EXPOSURE APPARATUS AND EXPOSURE METHOD FOR MINIMIZING DEFOCUSING OF THE TRANSFERRED PATTERN

[75] Inventors: Kinya Kato, Yokohama; Kazuaki Saiki, Setagaya; Masami Seki, Shiki; Masaki Kato, Yokohama, all of Japan

[73] Assignee: Nikon Corporation, Japan

[21] Appl. No.: 349,869

[22] Filed: Dec. 6, 1994

[30] Foreign Application Priority Data

| Dec. 6, 1993 | [JP] | Japan | 5-339769 |
| Mar. 28, 1994 | [JP] | Japan | 6-057087 |
| May 13, 1994 | [JP] | Japan | 6-124597 |

[51] Int. Cl.⁶ .................................................. H01L 21/027
[52] U.S. Cl. ................................ 355/53; 355/55; 250/548
[58] Field of Search .............................. 355/53, 67, 55; 250/548; 356/356, 358, 400, 401

[56] References Cited

U.S. PATENT DOCUMENTS

| 4,558,949 | 12/1985 | Uehara et al. | 356/152 |
| 4,770,531 | 9/1988 | Tanaka et al. | 356/358 |
| 4,952,970 | 8/1990 | Suzuki et al. | 355/53 X |
| 5,194,893 | 3/1993 | Nishi | 355/53 |
| 5,343,291 | 8/1994 | Ohwada et al. | 356/356 |
| 5,502,311 | 3/1996 | Imai et al. | 250/548 |
| 5,502,313 | 3/1996 | Nakamura et al. | 355/53 X |

FOREIGN PATENT DOCUMENTS

| 59-102186 | 6/1984 | Japan . |
| 62-274201 | 11/1987 | Japan . |
| 4-142438 | 5/1992 | Japan . |
| 4-1436079 | 5/1992 | Japan . |
| 4-302131 | 10/1992 | Japan . |

*Primary Examiner*—Joan H. Pendegrass
*Attorney, Agent, or Firm*—Pennie & Edmonds LLP

[57] ABSTRACT

An exposure apparatus and an exposure method which minimize defocusing of the transferred pattern even with a large-sized mask. When the exposure apparatus is used which transfers the pattern formed on a first substrate through a substantially real-size projection optical system onto a second substrate, the positions of the mask and the substrate are detected, and based on the information on the positions the distance between the mask and the substrate is controlled to be substantially constant. According to the present invention, defocusing of the transferred pattern may be substantially avoided by detecting positions of the mask and the plate by making use of, e.g., an obliquely incident light focus detection optical system, and controlling the distance therebetween to be held constant or at a predetermined distance.

29 Claims, 21 Drawing Sheets

EXPOSURE APPARATUS AND EXPOSURE METHOD FOR MINIMIZING DEFOCUSING OF THE TRANSFERRED PATTERN

BACKGROUND OF THE INVENTION

1. Field of the Invention

The present invention relates to an exposure apparatus and an exposure method available for exposure of a mask pattern on a photosensitive substrate during the manufacture of, for example, semiconductor elements or liquid crystal display elements, and particularly to an exposure apparatus equipped with an automatic focusing mechanism and an exposure method utilizing the exposure apparatus.

2. Related Background Art

FIG. 1 is a schematic view showing the structure of a conventional exposure apparatus.

In FIG. 1, a pattern formed on a fixed mask (e.g., reticle) 121 is transferred to a substrate 123 through a projection optical system 122. Here, detection of the focus or positional detection on the image formation surface of the projection optical system has been performed only on the substrate 123 using a focus-detecting optical system for exposure substrates.

With the focus-detecting optical system mentioned above, light emitted from a light source 101, such as an LED, travels via a lens 102 and a visual field slit 103, and is reflected by a mirror 104. The light reflected by the mirror 104 advances through an aperture stop 105 and a lens 106 to strike a mirror 107.

The light reflected by the mirror 107 falls on a substrate 123 obliquely, and strikes a mirror 107' due to specular reflection. The light reflected by the mirror 107' passes through a lens 106' and an aperture stop 108 to strike a mirror 109. The light reflected by the mirror 109 is received by an image sensor 111.

In FIG. 1, if the substrate 123 moves upward in the drawing to the location 123' (shown by a broken line in the drawing), then the light-receiving position on the image sensor 111 for the reflected light from the substrate 123 is displaced downward in the drawing.

Therefore, the upward or downward displacement of the substrate 123 in the drawing may be detected based on the light-receiving position for the reflected light from the substrate 123, and thus the positioning of the substrate 123 has been controlled so that the reflected light is received at a predetermined point, and consequently the substrate 123 is positioned at a predetermined place. As mentioned above, with conventional exposure apparatuses, detection of the focal point has been made only on the surface of the substrate 123 as the exposure object. Accordingly, if up-sizing the mask 121 involves significant bending of the mask 121 due to its own weight or slanting (tapering) of the surface because of a manufacturing error, then detection of the focal point only on the substrate 123, or the exposure object, has inconveniently failed to prevent the occurrence of defocusing of the transferred pattern due to the bending or tapering of the mask 121.

SUMMARY OF THE INVENTION

The present invention has been accomplished taking the above-mentioned problems into consideration, and aims to present an exposure apparatus and an exposure method which minimize defocusing of the transferred pattern even with a large-sized mask.

According to the present invention, when an exposure apparatus is used which transfers the pattern formed on a mask as a first substrate through a substantially real-size projection optical system, to an exposure substrate as a second substrate, the positions of the mask and the substrate are detected, and based on the information on the positions the distance between the mask and the substrate is controlled to be substantially constant.

Here, if the system is composed so that the quantity of obliquely incident light to the first substrate and the quantity of obliquely incident light to the second substrate are controlled individually, then, even with a remarkable difference between the reflection factor of the mask as the first substrate and the reflection factor of the exposure substrate as the second substrate it is possible to prevent the quantitative difference of the reflected light from the respective substrates from exceeding the dynamic range of the photosensor which leads to a signal processing impossibility, or lowered accuracy which results from the decreased S/N ratio.

In the same manner, if-the system is composed so that the sensitivity of a first photosensor which receives the reflected light from the first substrate, and the sensitivity of a second photosensor which receives the reflected light from the second substrate are controlled individually, then even with a remarkable difference between the reflection factor of the mask as the first substrate and the reflection factor of the exposure substrate as the second substrate, it is possible to avoid a signal processing impossibility, or lowering in accuracy which results from the quantitative difference of the reflected light from the respective substrates, by properly changing the input gain of the sensors.

In addition, as described later, with an exposure apparatus utilizing a substantially real-size projection optical system, defocusing of the transferred pattern may be substantially avoided by keeping constant the distance between the mask and the substrate.

Since up-sizing the photosensitive substrate involves scaling-up of the mask in a substantially real-size exposure apparatus, bending of the mask due to its own weight and slanting of the surface become significant. Furthermore, since the mask is scaled up, projection exposure is performed while scanning the mask and the substrate relative to the projection optical system. Therefore, according to the conventional detection of the focal point only on the substrate, the transferred pattern tends to defocus over the range of scanning.

For this reason, preferably prescanning in a non-exposure condition is carried out to detect positions of the mask and the substrate at a plurality of points, and then, based on the resulting positional information the distance between the mask and the substrate is adjusted to a constant value as close as possible over the entire range of scanning prior to projection exposure.

In this connection, even with a general exposure apparatus utilizing a non-real-size projection optical system, defocusing of the transferred pattern may be substantially avoided by detecting the position of the mask and the position of the substrate, and controlling the movement of at least either the mask and the substrate so that the distance therebetween is kept at a predetermined distance. In this case, it is preferred that the mask and/or the substrate are moved to predetermined positions based on the information on the detected position of the mask and on the information on the detected position of the substrate.

As mentioned above, according to the present invention, defocusing of the transferred pattern may be substantially avoided by detecting positions of the mask and the plate by making use of, e.g., an obliquely incident light focus detection optical system, and controlling the distance therebetween to be held constant or at a predetermined distance.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
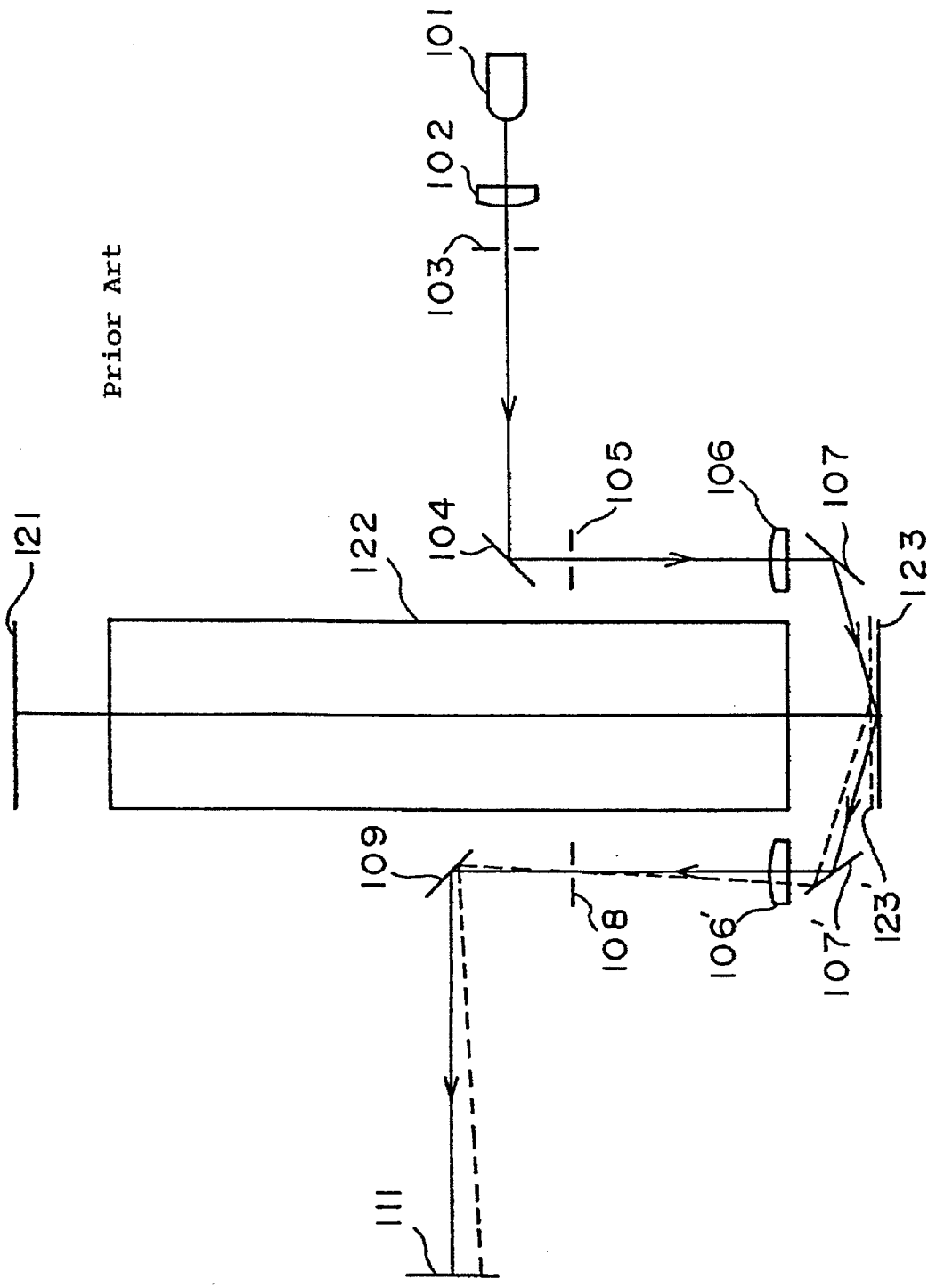
FIG. 1 is a schematic view showing the structure of an conventional exposure apparatus, wherein the position of the plate alone is detected with an optical detection system.
Figure 2:
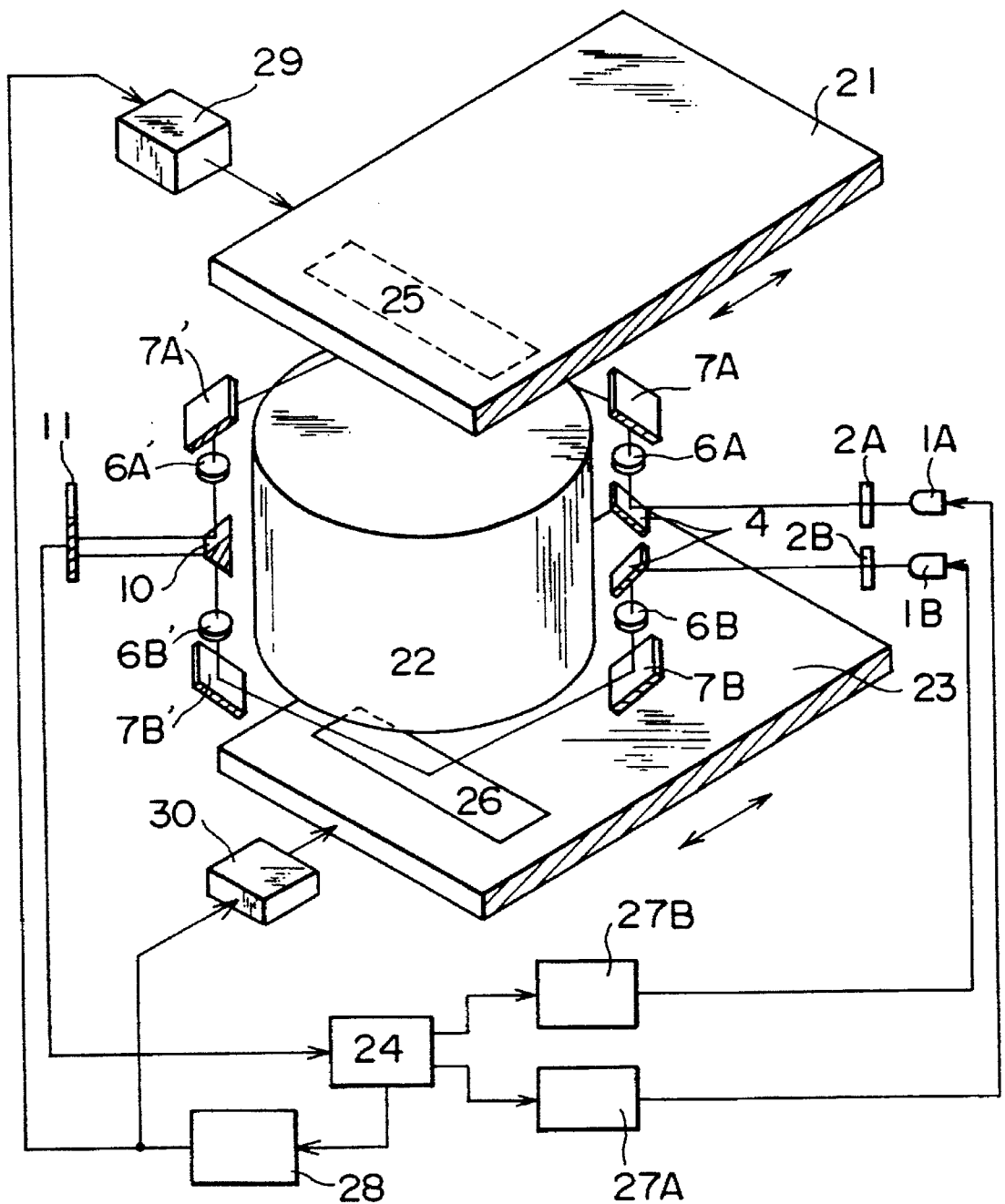
FIG. 2 is a perspective view showing the structure of an exposure apparatus according to an embodiment of the present invention.
Figure 3:
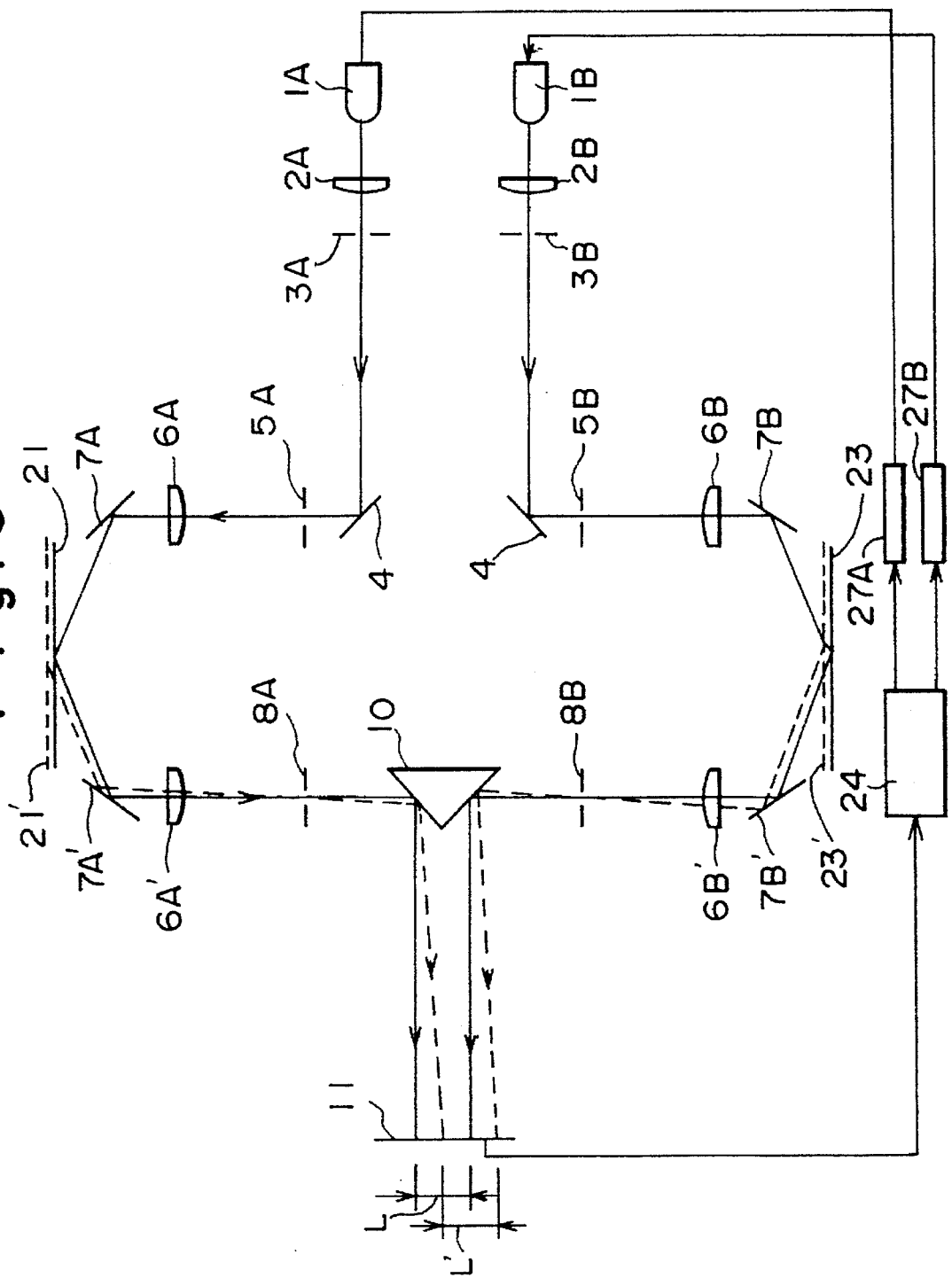
FIG. 3 is a view showing the structure of a position detection system of the exposure apparatus of FIG. 2.

Embodiments of the present invention will be described with reference to the accompanying drawings. FIG. 2 is a perspective view showing the structure of an exposure apparatus according to an embodiment of the present invention, while FIG. 3 is a view showing the structure of a position detection system of the exposure apparatus of FIG. 2. As is shown in FIG. 2 and FIG. 3, with the exposure apparatus of the present embodiment, the pattern formed on a mask 21 is transferred to a plate 23, or a substrate by uniform illumination with illumination means (not shown), through a real-size projection optical system 22.

As is shown, up-sizing the mask 21 and the plate 23 allows the effective field of view of the projection optical system 22 to be secured to within only the ranges 25 and 26 on the mask 21 and the plate 23, respectively. In this case, by moving the mask 21 and the plate 23 in a body relative to the projection optical system 22, in the direction indicated by the arrow, or by one-directional exposure scanning, projection exposure is performed over a desired wide exposure area.

As the position detection system for the exposure apparatus of the present invention, there may be used, e.g., an oblique incidence focus detection optical system, as is shown. The shown position detection system is provided with two light sources 1A and 1B each having means capable of changing the quantity of light individually. As is shown in FIG. 3, the light emitted from the light source 1A (1B) travels through a lens 2A (2B) and a visual field slit (field stop) 3A (3B) and is reflected by a mirror 4 upward (downward) in the drawing. The light reflected by the mirror 4 strikes a mirror 7A (7B) via an aperture stop 5A (5B) and a lens 6A (6B).

The light reflected by the mirror 7A (7B) leftward in the drawing, strikes a mask 21 (plate 23) as a ray of oblique incidence, and then falls on a mirror 7A' (7B') due to specular reflection. The light reflected by the mirror 7A' (7B') downward (upward) in the drawing travels via a lens 6A' (6B') and an aperture stop 8A (8B) to falls on a prism 10. The two rays of reflected light separately deflected by a prism 10 leftward in the drawing are received by the same two-dimensional sensor (or a one-dimensional sensor such as CCD) 11. The sensor 11 detects the positions and the quantities of light of the two rays of reflected light, and outputs electric signals based on the quantities of light, to a signal processing section 24. When the signal processing section 24 determines that the electric signals based on the two rays of reflected light indicate that they are outside the input range for the sensor 11, a command for a proper quantity of light is output therefrom to either or both of the two light source control units 27A and 27B to control the quantities of light from the light sources 1A and 1B. Incidentally, the visual field slits 3A and 3B, and the aperture stops 5A, 5B, 8A and 8B are not shown in FIG. 2.

The visual field slit 3A (3B) of the position detecting system illustrated in FIG. 3 has a slit-like aperture with its lengthwise direction perpendicular to the plane of the sheet of FIG. 3. The visual field slit 3A (3B) is conjugate with the plane 23. Thus, a slit-like image of the aperture of the visual field slit 3A (3B) is formed on the plate 23 (or mask 21). An angle formed by these images with its lengthwise direction and the scanning direction is 45°.

Figure 4:
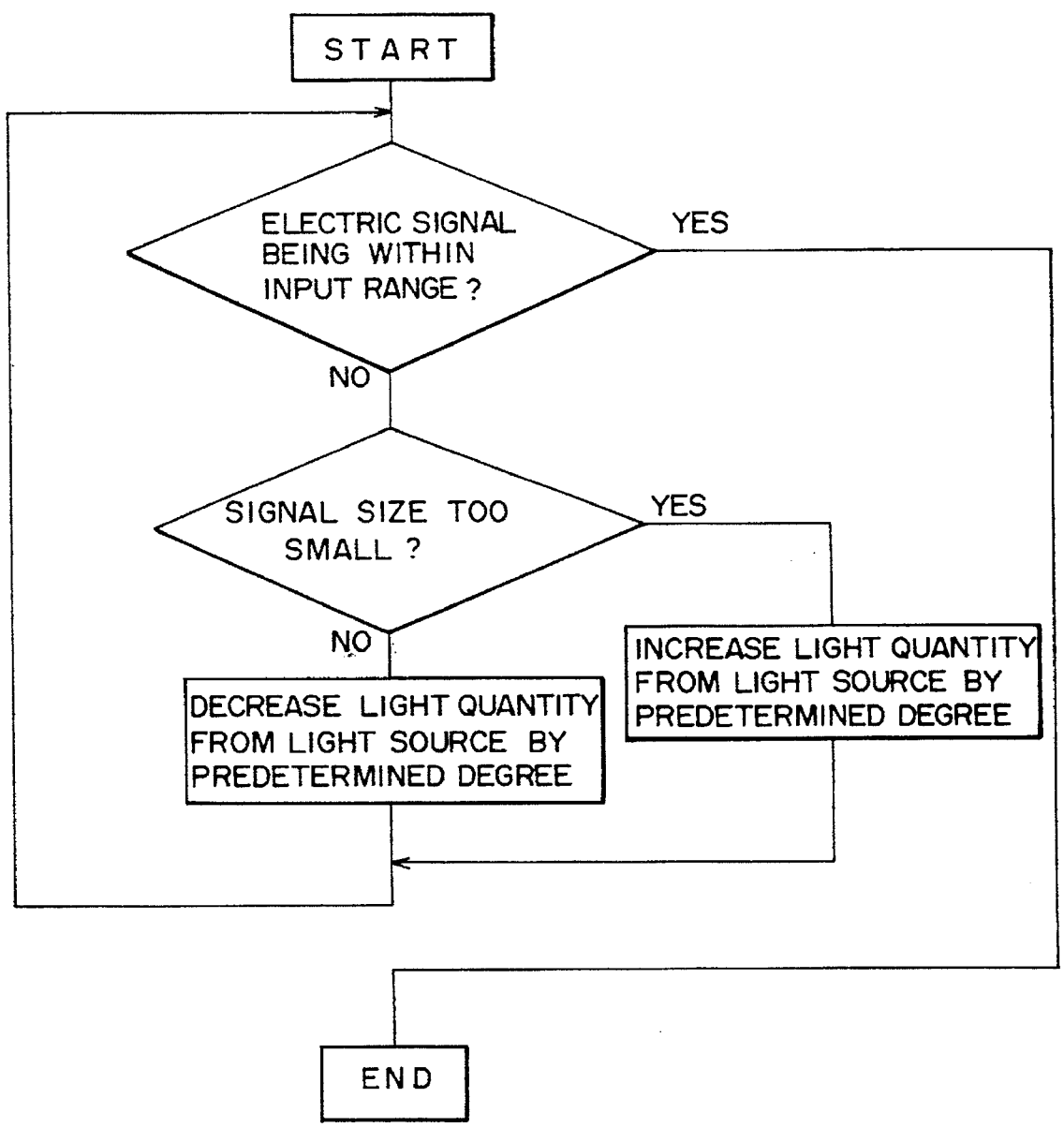
FIG. 4 is a flow chart showing an algorithm for determining a command for an appropriate quantity of light from the light sources shown in FIG. 2 and FIG. 2.

The flow chart of FIG. 4 illustrates an algorithm for determining a command for the proper quantity of light discussed above to each of the light sources 1A and 1B. The signal processing section may be constructed of, e.g., a microcomputer and a peripheral circuit for the input and output of signals.

As the flow chart of FIG. 4 illustrates, when the signal processing section 24 determines that the electric signal corresponding to each reflected light ray is within the input range for the sensor 11, then the quantity of light from the light source in question is not controlled. Contrastively, when the electric signal corresponding to each reflected light is not within the input range for the sensor 11, the quantity of light from the corresponding light source is increased by a predetermined level if the signal size is too small, and the quantity of light from the corresponding light source is decreased by a predetermined degree if the signal size is too large.

Thus, the two slit images are projected on the two-dimensional sensor 11, which correspond to the mask 21 and the plate 23, respectively, and a proper electric signal is produced by cooperative functioning of the signal processing section 24, light source control units 27A and 27B, and light sources 1A and 1B. In this connection, in FIG. 3, visual field slits 3A and 3B are arranged so that their lengthwise directions are perpendicular to the sheet of paper.

When the mask 21 and the plate 23 are located at predetermined positions indicated by solid lines in the drawing, the distance between the two slit images formed on the two-dimensional sensor 11 is L.

In FIG. 3, when the mask 21 moves upward to the position 21' in the drawing (indicated by a broken line), and the plate 23 moves upward to the position 23' in the drawing (indicated by a broken line), both the light-receiving positions on the two-dimensional sensor 11 for the reflected light from the mask 21 and the plate 23 is displaced downward in the drawing. As a result, as indicated by a broken line in the drawing, the distance between the two slit images becomes L'.

Incidentally, the optical system is constructed symmetrically so as to equalize the values of L and L'. When the mask 21 and the plate 23 travel the same length in the same direction in the drawing, that is, when the distance between the mask 21 and the plate 23 is kept constant.

Figure 5:
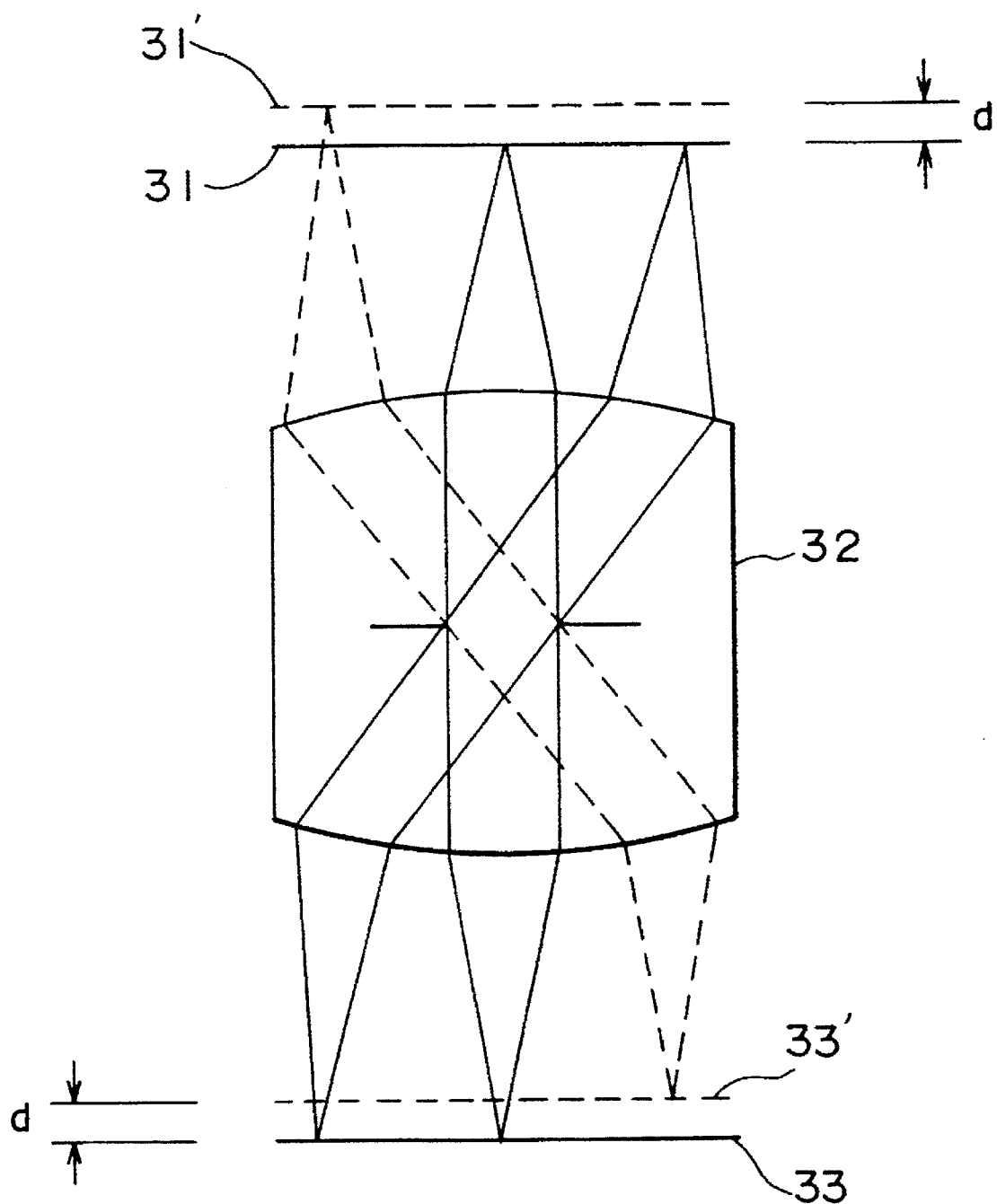
FIG. 5 is a view showing a real-size projection optical system and a conjugate relationship between the mask and the plate.

FIG. 5 is a view showing a real-size projection optical system and a conjugate relationship between the mask and the plate.

In FIG. 5, the pattern formed on the mask 31 is imaged on a substrate 33 such as a plate, through a real-size projection optical system 32. When the mask 31 moves through a distance d upward in the drawing to reach the position 31' indicated by a broken line, the imaging position of the pattern is displaced the same distance d from the location of the substrate, upward in the drawing. Therefore, if the substrate 33 is moved to the position indicated by a broken line in the drawing so as to keep constant the distance between the mask 31 and the substrate 33, then the conjugate relationship is held, and the transferred pattern is not defocused.

Accordingly, with an exposure apparatus as shown FIG. 2 and FIG. 3, when the movement of at least either of the mask 23 and the plate 23 is controlled with a driving control unit 28 and driving units 29, 30 so that the distances L and L' are always constant, defocusing of the transferred pattern may be substantially avoided.

Alternatively, the movement of both the mask 21 and the plate 23 may be controlled so that the reflected light from the mask 21 and the plate 23 advances along the optical paths indicated by solid lines in FIG. 3 to be received at the respective predetermined positions on the two-dimensional sensor 11, and consequently the mask 21 and the plate 23 are positioned at predetermined positions.

Figure 6A:
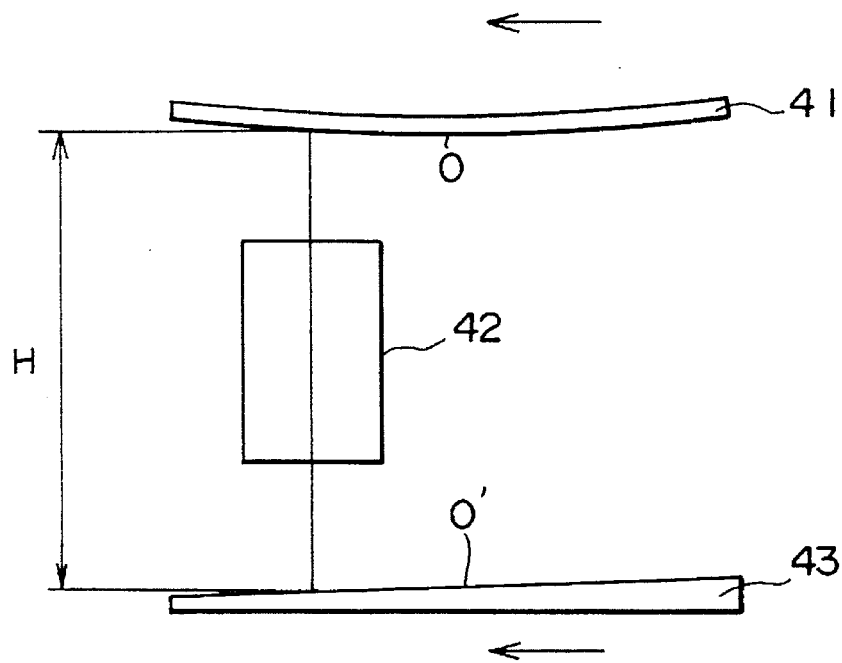
FIG. 6A and FIG. 6B are views showing bending of the mask due to its own weight, and the state of the tapered surface of a plate, FIG. 6A illustrating the state of the mask and the plate prior to non-exposure prescanning, and 6B illustrating the state of the mask and the plate subjected to corrective positioning after prescanning.
Figure 6B:
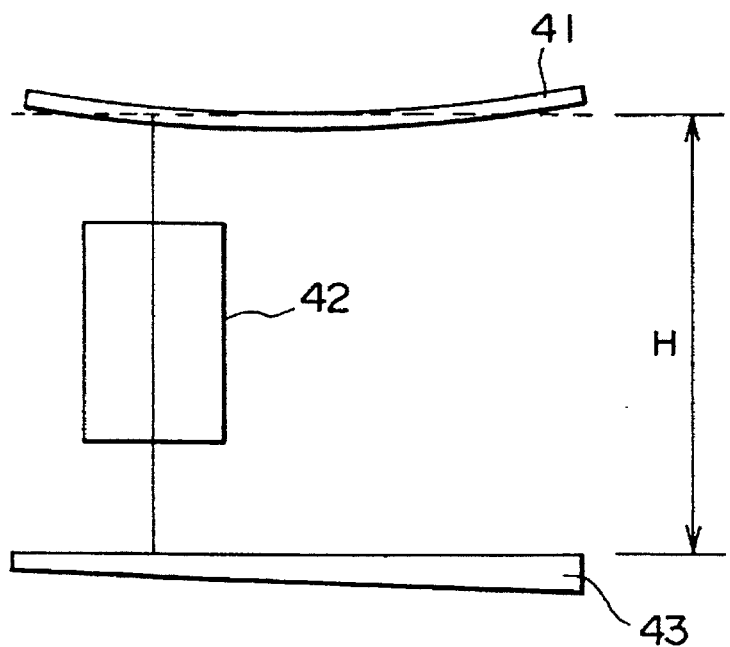

FIG. 6A and FIG. 6B are views showing bending of the mask due to its own weight, and the slanted state of the plate surface, FIG. 6A illustrating the state of the mask and the plate prior to non-exposure prescanning, and FIG. 6B illustrating the state of the mask and the plate subjected to corrective positioning after prescanning.

Generally, since the mask is supported at its perimeter, bending due to its own weight becomes a problem. On the other hand, although the plate which is wholly supported on the stage is not deformed by bending, slanting of its surface becomes a problem.

In cases where the mask 41 bends due to its own weight, and the surface of the plate 43 slants, as is shown in FIG. 6A, even with the distance between the center O of the mask 41 and the plate 43 kept at a predetermined distance H, it is impossible to keep this distance between the mask 41 and the plate 43 at the predetermined distance H along the entire direction of scanning (indicated by an arrow in the drawing). As a result, when the pattern formed on the mask 41 through the real-size projection optical system 42 is transferred to the plate 43 while scanning in the direction indicated by the arrow in the drawing, though defocusing is not observed around the center O' of the plate 43, defocusing of the transferred pattern occurs at the perimeter.

For this reason, the positions of the mask 41 and the plate 43 are detected with the position detection optical system of FIG. 3, while prescanning in a non-exposure condition. Based on the information on the detected positions, in order to minimize the difference of the distance between the mask 41 and the plate 43 from the predetermined distance H along the entire scanning direction, at least either the mask 41 and the plate 43 is controlled for positioning.

Thus, if, as is shown in FIG. 6B, corrective positioning is performed after prescanning, and then the pattern formed on the mask 41 is transferred to the plate 43 through the real-size projection optical system 42, it becomes possible to perform projection exposure free from defocusing of the transferred pattern substantially over the entire surface of the plate 43.

Next, with reference to FIG. 7A and FIG. 7B the structure of the exposure apparatus will be explained in detail.

The position detection optical system (a focus detection unit 218) is supported by a frame 203 of the exposure apparatus together with projection optical systems 201 and 202 which form an erect image of a mask 21 on a plate 23. These projection optical systems 201 and 202 may involve an application of an optical system disclosed in, e.g. U.S.

patent application No. 259,771 (filed on Jun. 14, 1994) made by the same applicant as the present applicant. On the other hand, an illumination optical system 204 which illuminates the mask 21 is also supported by the frame 203 of the exposure apparatus. This frame 203 is fixed on a pedestal 205.

Further, the plate 23 is mounted by vacuum suction on a plate stage 206 movable in the XY direction, while the mask 21 is mounted by vacuum suction on a mask stage 207 movable in the direction along the XY plane and in the direction of rotation θ around the Z axis. The plate stage 206 is supported by three supporting sections 208, and the three supporting sections 208 are movable in the direction of Z, respectively.

Figure 8:
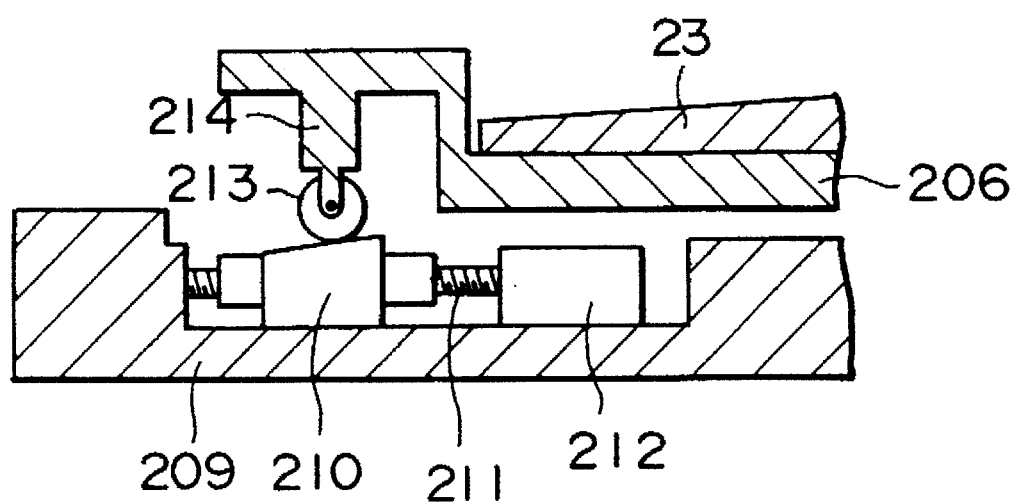
FIG. 8 is a view showing the details of the structure of a supporting section.

The structure of the supporting sections 208 will be explained specifically with reference to FIG. 8. The plate 23 is mounted on the plate stage 206 by vacuum suction, and plate supporting sections 208 are provided at three points around the plate stage 206. FIG. 8 shows one of the plate supporting sections 208 in an enlarged manner. A wedge-shaped member 210 is mounted on the base 209 in a movable manner, and a feed screw 211 is situated in a threaded hole provided in the wedge-shaped member 210. The feed screw 211 is rotated by a motor 212. On the wedge-shaped member there is mounted a roller 213, and the roller 213 is attached to a projection section 214 of the plate stage 206 in a rotatable manner. With this structure, rotation of the motor 212 causes the feed screw 211 to rotate, and the wedge-shaped member 210 to move, thereby allowing the perimeter section of the plate stage 206 to move up and down via the roller. Here, the frictional force is reduced due to the rotation of the roller 213.

Since the plate supporting sections 208 with the above-mentioned structure are provided at three points around the plate stage 206, control may be made regarding the top and bottom positions of the plate 23, and a two-degree-of-freedom inclination.

Figure 9A:
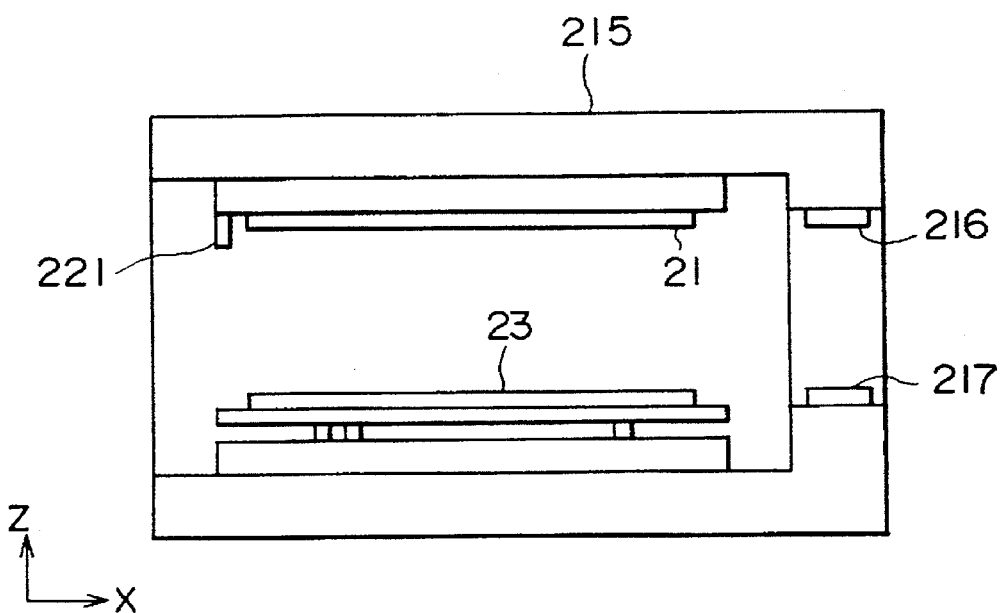
FIGS. 9A–9C are views showing the details of the structure of a carriage.
Figure 9B:
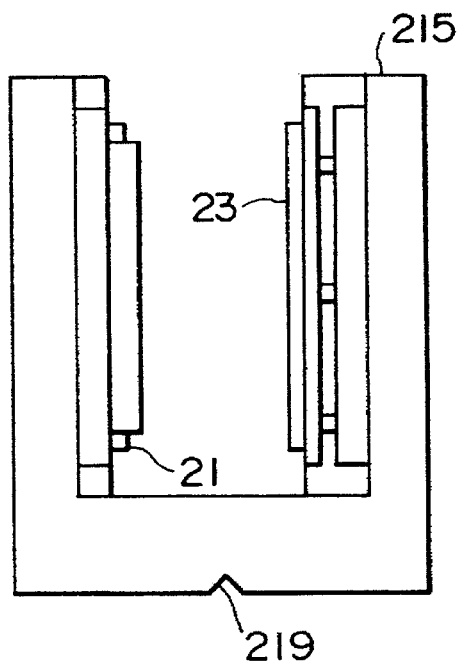
Figure 9C:
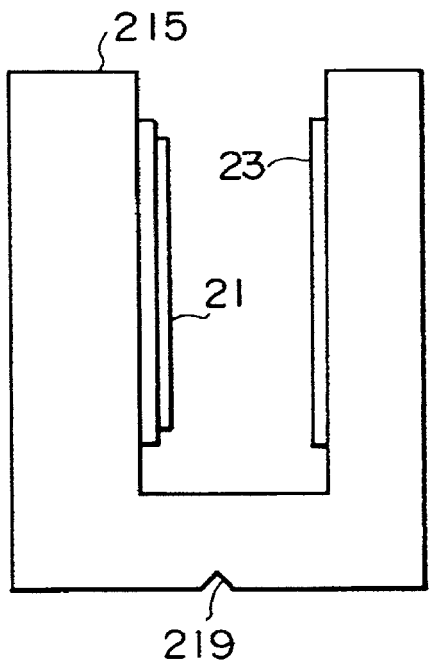

FIG. 9A through FIG. 9C are drawings of the carriage 215 when viewed from three different directions. As these drawings show, the three plate supporting sections 208 are mounted on the C-shaped section carriage 215. On the other hand, at one X-directional end of the carriage 215 there are fixed Z-directional reference plates 216 and 217.

Figure 7A:
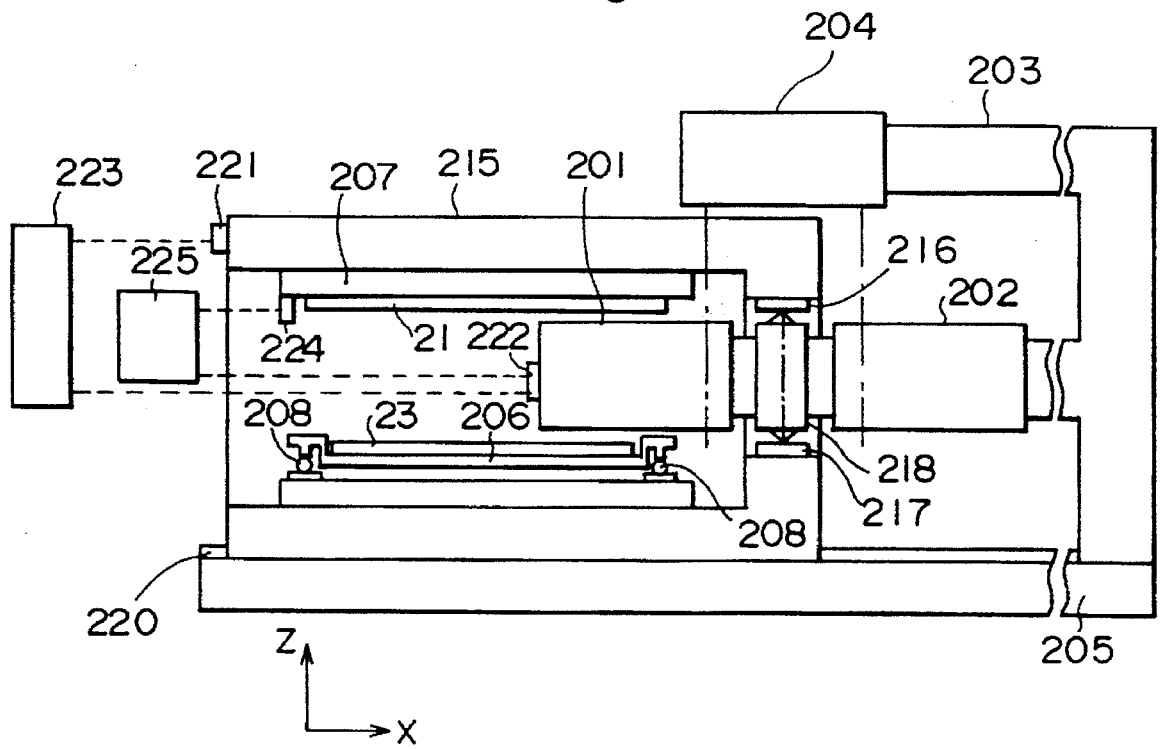
FIGS. 7A and 7B are views showing the details of the structure of an exposure apparatus according to an embodiment of the present invention.
Figure 7B:
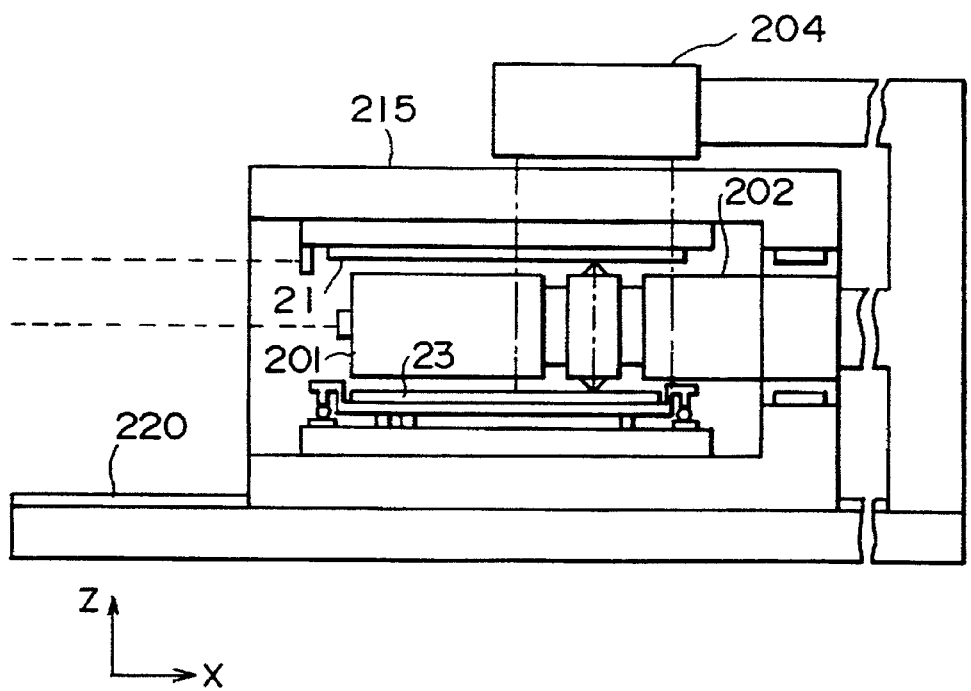

Now returning to FIG. 7 A and FIG. 7B, the carriage 215 is placed on the pedestal 205 in the X direction in a movable manner. Relative to the frame 203, the pedestal 205, the projection optic systems 201 and 202 and the focus detection unit 218 of the exposure apparatus, the carriage 215 moves, and thus the mask 21 and the plate 23 move accordingly.

In the carriage at the +Z-directional side of the Z-directional reference plate 216, there is provided an opening section for passing light from an illumination optical system 204. This opening section is for illuminating the pattern for calibration mounted on the Z-directional reference plates 216 and 217.

Further, as FIG. 9A and FIG. 9B show, in the carriage 215 there is provided a V-groove 219, while the pedestal 205 is equipped with a guide 220 along the X direction which fits in the V-groove of the carriage 215 (see FIG. 7A and FIG. 7B). This carriage is moved in the X direction by, e.g., a linear motor.

In addition, for detection of the X-directional position of the carriage 215, the carriage 215 is equipped with a travelling mirror 221, while the projection optical system 201 is equipped with a fixed mirror 222. A first interferometer system 223 detects the X-directional position of the carriage 215 relative to the projection optical system. Furthermore, for detection of the X-directional position of the mask stage 207, the mask stage 207 is equipped with a travelling mirror 224, while the fixed mirror 222 is also used here in common. A second interferometer system 225 detects the X-directional position of the mask stage 207 relative to the projection optical system 201. With these first and second interferometer systems 223 and 225 the X-directional position of the mask 21 may be detected.

Figure 10:
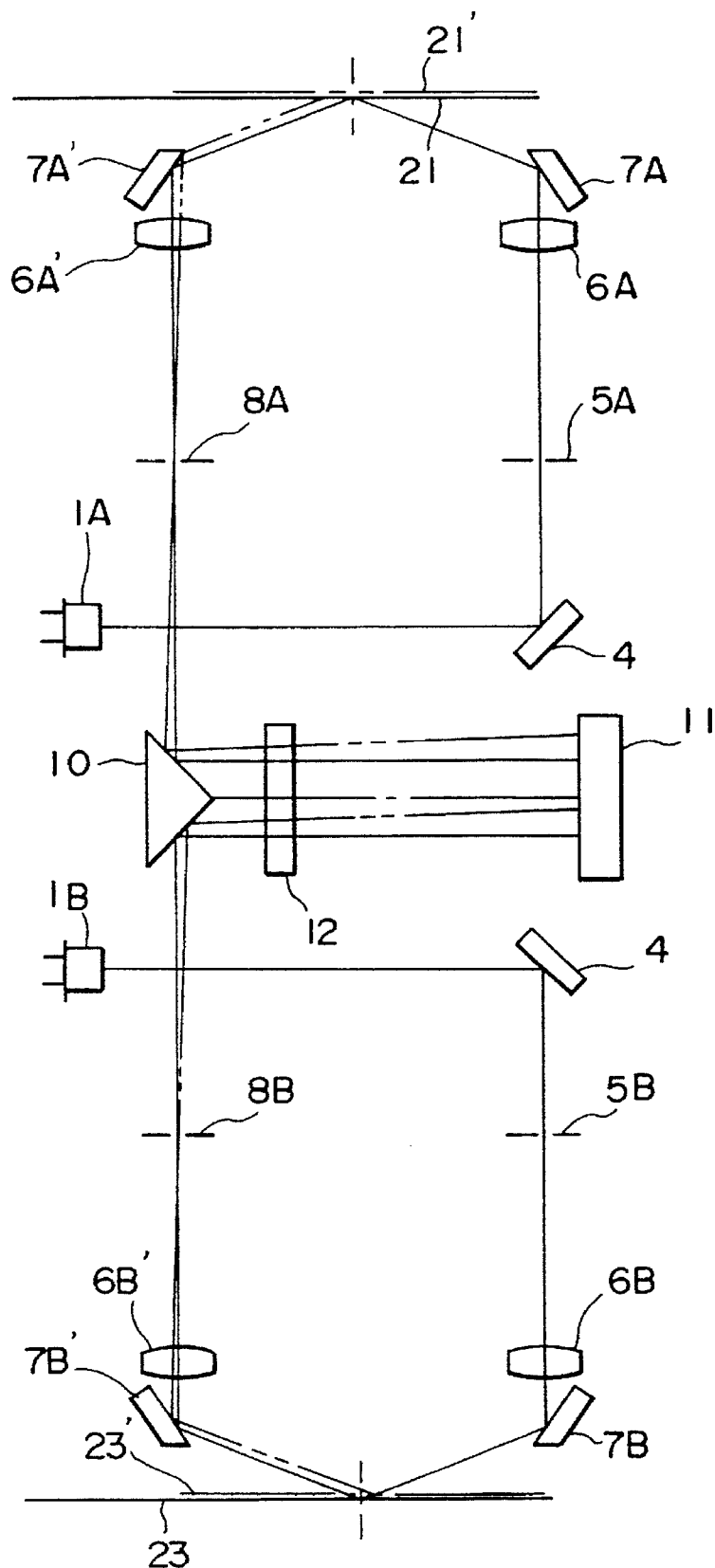
FIG. 10 is a view showing the structure of the focal point detection unit used in the exposure apparatus shown in FIG. 7A and FIG. 7B.

In this connection, as FIG. 7A and FIG. 7B show, a focus detection unit 218 is situated between the projection optical systems 201 and 202. A schematic diagram of this focus detection unit 218 is shown in FIG. 10. The focus detection unit 218 of FIG. 10 is similar to the one shown in FIG. 3 with the exception that it has a cylindrical lens 12 arranged in front of the one-dimensional sensor 11. This cylindrical lens 12 compress the slit-like beam of light from the mask 21 and/or plate 23.

Subsequently, the focus detection operation will be explained. In order to accomplish the operation, the following structure is employed.

The Z-directional reference plate 216 at the side of the mask, and the Z-directional reference plate 217 at the side of the plate are installed so as to provide the highest level of focusing when the mask 21 and the plate 23 are located at their positions in the Z-direction.

Focus detection points are provided at four points in the direction perpendicular to the scanning direction (Y direction). In other words, there are four sets of focus detection units 218. In the following description, the results of detection and the results of calculation for these sets are referred to by subscripts a through d.

Figure 11:
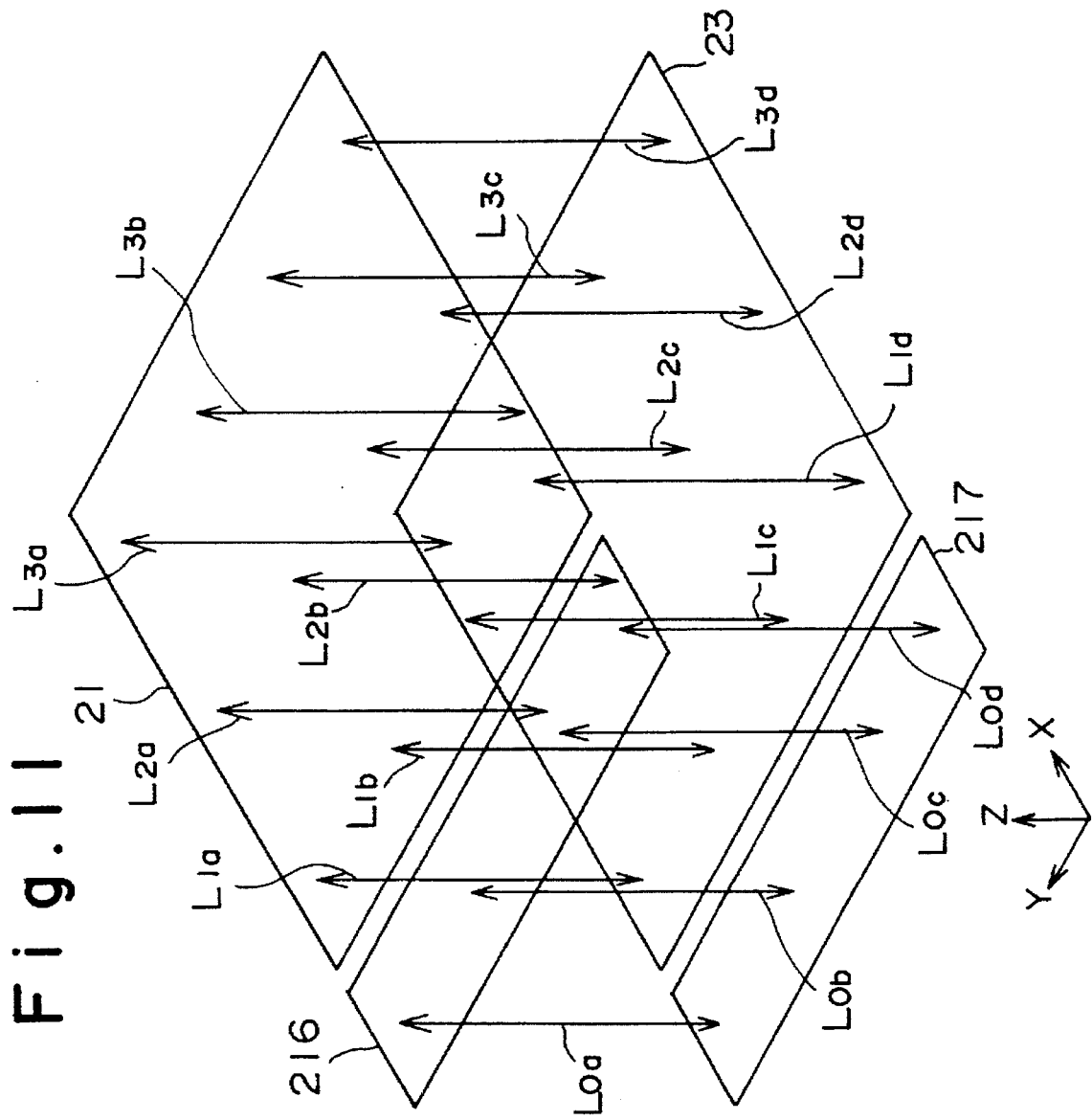
FIG. 11 is a view showing the arrangement of focus detection points on the plate and the mask.

As is shown in FIG. 11, there are twelve focus detection points on the plate 23 and the mask 21.

Figure 12A:
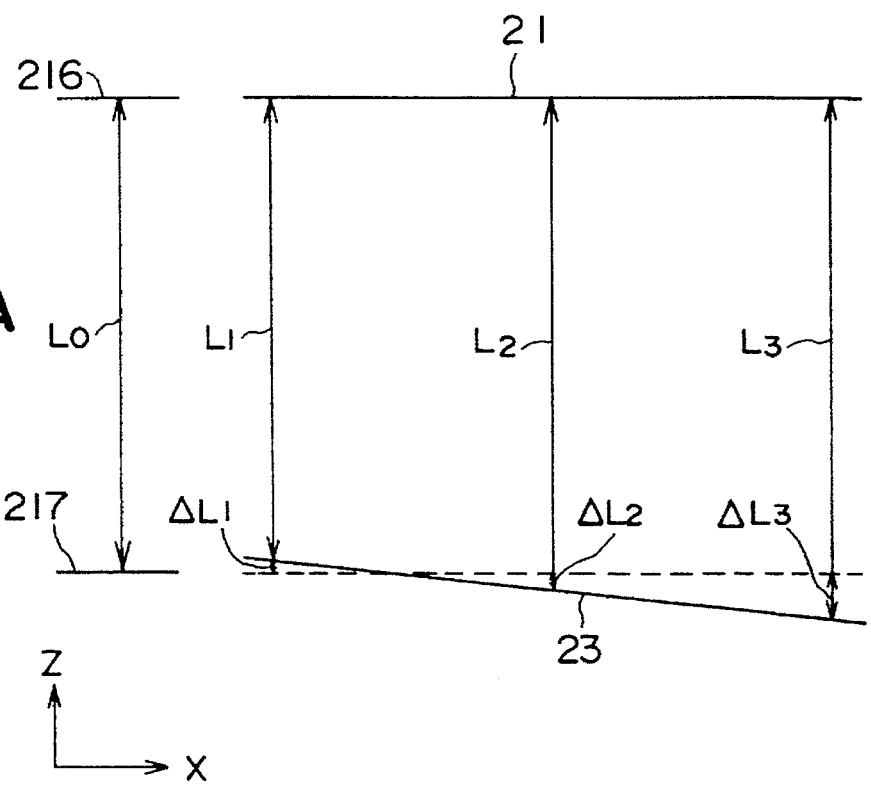
FIG. 12A and FIG. 12B are views showing the distance between the reference plate on the side of the mask and the reference plate on the side of the plate, and the distance between the mask and the plate.

Here, as is shown in FIG. 12A, in the XY plane, the focus detection unit 218 detects Z-directional distances $L_1$ through $L_3$ between the mask 21 and the plate 23, and calculates displacements $\Delta L_1$ through $\Delta L_3$ from the distance $L_0$ between the mask's-side reference plate 216 and the plate's-side reference plate 217, and based on the results of this calculation the plate stage is driven to situate the plate 23 in the same plane as of the plate's-side reference plate 217.

Figure 12B:
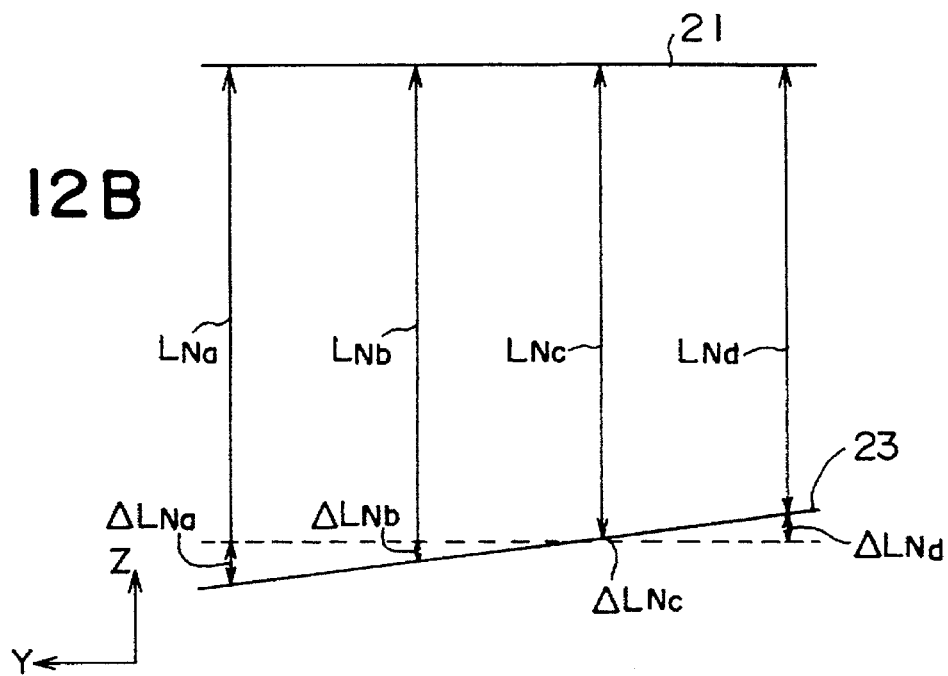

On the other hand, as is shown in FIG. 12B, in the YZ plane, the focus detection unit 218 detects Z-directional distances $L_{Na}$ through $L_{ND}$ between the mask 21 and the plate 23, and calculates displacements $\Delta L_{Na}$ through $\Delta L_{Nd}$ from the distance $L_0$ between the mask's-side reference plate 216 and the plate's-side reference plate 217, and based on the results of this calculation the plate stage 206 is driven to situate the plate 23 in the same plane as of the plate's-side reference plate 217. Here, N stands for the number of the detection points in the X direction, and specifically is three in the case of FIG. 11.

Figure 13:
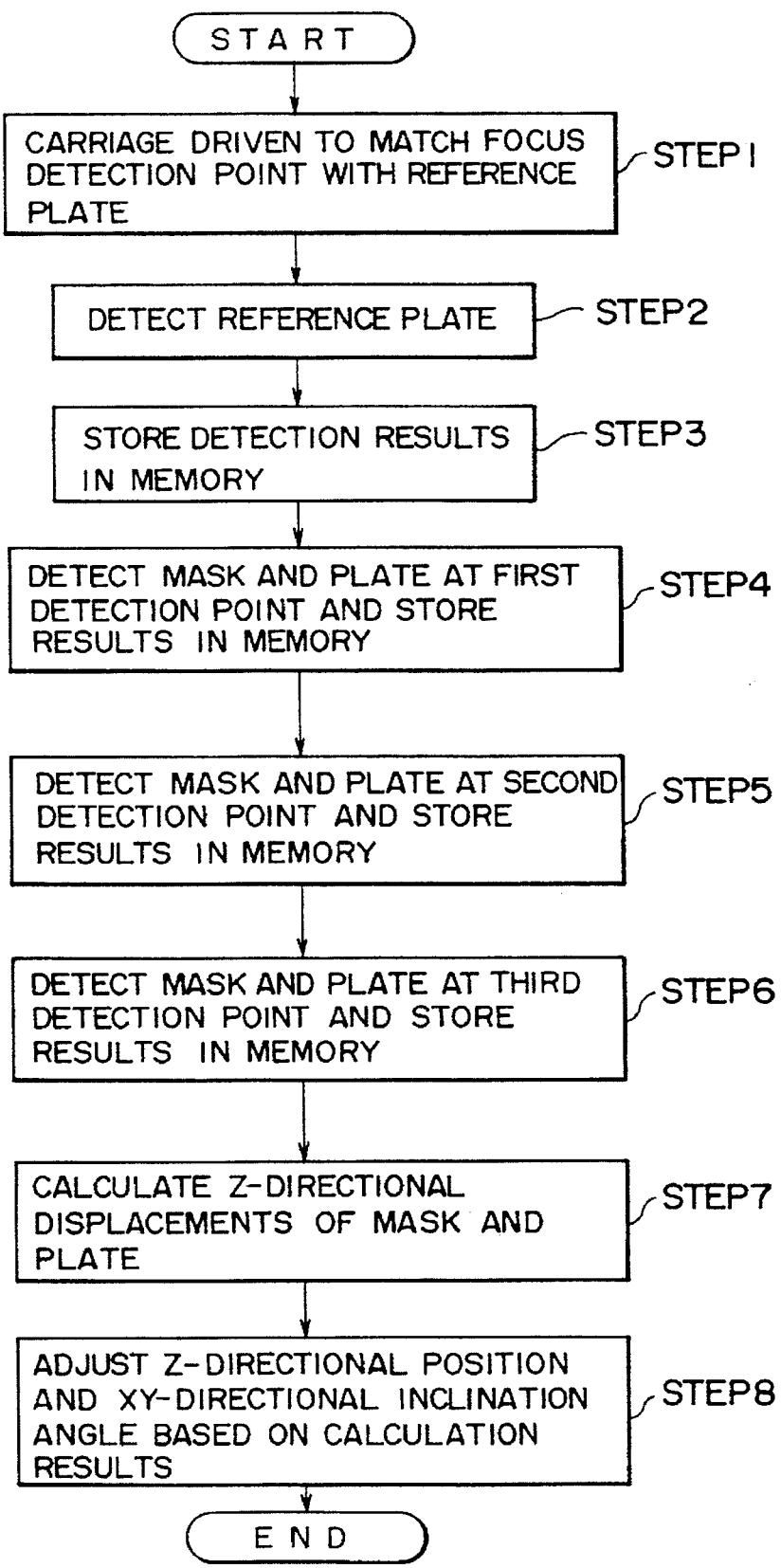
FIG. 13 is a flow chart illustrating the focal point detection operation for the case of three detection points.

A further explanation will be made while referring to the flow chart of FIG. 13.

[Step 1]

The control section 24 moves the carriage 215 along the X direction (scanning direction) so as to match the focus detection points with the Z-directional reference plates 216 and 217 in the X direction.

[Step 2]

The control section 24 detects the Z-directional reference plate 216 at the side of the mask 21, and the Z-directional reference plate 217 at the side of the plate 23. Here, based on the positions $Z_{Ma}$ through $Z_{Md}$ of the reflected light from the detection points on the mask 21 to be projected on the sensor 11, and on the positions $Z_{Pa}$ through $Z_{Pa}$ of the reflected light from the detection points on the plate 23, the distances $L_{0a}=Z_{Pa}-Z_{Ma}, \ldots, L_{0d}=Z_{Pd}-Z_{Md}$ between the positions of the reflected light are calculated.

[Step 3]

The control section 24 functions to store the positions $Z_{Ma}$ through $Z_{Md}$ and $Z_{Pa}$ through $Z_{Pd}$ of the reflected light, and the distances $L_{0a}$ through $L_{0d}$ between the positions of the reflected light in a memory.

[Step 4]

The control section 24 drives the carriage 215 in the X direction, and detects the mask 21 and the plate 23 at a first detection point. In other words, positions $Z_{M1a}$ through $Z_{M1d}$ and $Z_{P1a}$ through $Z_{P1d}$ of the reflected light on the sensor 11 are detected. Then, based on the results of this detection, the distances $L_{1a}=Z_{P1a}-Z_{M1a}, \ldots, L_{1d}=Z_{P1d}-Z_{M1d}$ are calculated, and these $Z_{M1a}$ through $Z_{M1d}$, $Z_{P1a}$ through $Z_{P1d}$ and $L_{1a}$ through $L_{1d}$ are stored in the memory. At the same time, the Z-directional position of the first detection point is detected with an interferometer system, and the resulting positional information is stored in the memory.

[Step 5]

In the same manner the control section 24 drives the carriage 215 in the X direction, and detects the mask 21 and the plate 23 at a second detection point.

[Step 6]

The same operation is carried out for a third detection point.

In this way, the distance between the mask 21 and the plate 23 is detected at a plurality of detection points along the X direction. Here, the description is made on the assumption that the number of the detection points along the X direction is three; the control section 24 repeats the same step as Step 4 or Step 5 for cases of more detection points.

[Step 7]

The control section 24 calculates the Z-directional displacements ΔL of the plate 23 from the Z-directional reference plates 216 and 217 at the side of the mask 21 and at the side of the plate 23, respectively. Here, $L_{1a}-L_{0a}=\Delta_{1a}$, $L_{2a}-L_{0a}=\Delta L_{2a}$, $L_{3a}-L_{0a}=\Delta L_{3a}, \ldots, L_{1d}-L_{0d}=\Delta L_{1d}$, $L_{2d}-L_{0d}=\Delta L_{2d}$, and $L_{3d}-L_{0d}=\Delta L_{3d}$.

[Step 8]

The control section 24 adjusts the Z-directional position, angle of inclination in the X direction, and angle of inclination in the Y direction of the plate stage 206 so that all the $\Delta L_{1a}$ through $\Delta L_{1d}$, $\Delta L_{2a}$ through $\Delta L_{2d}$, and $\Delta L_{3a}$ through $\Delta L_{3d}$ become null.

By following the foregoing Steps 1–8, proper alignment of the patterned surface of the mask 21 with the resist-applied surface of the plate 23 is completed for focusing. Thereafter, the control section 24 moves to an exposure operation.

Although, in the above embodiment, the z-directional displacement of the plate 23 was detected by the prescanning, and based on the results of the detection, prior to exposure, the z-directional position and angles of inclination in the X and Y directions of the plate 23 were adjusted, the adjustment may be performed during the exposure. In addition, in this embodiment the structure is designed so that only the plate stage is movable in the Z direction, however, it may be constructed so that the mask stage 207 alone is capable of moving in the Z direction, or the two may be constructed to be movable in the Z direction.

Figure 14:
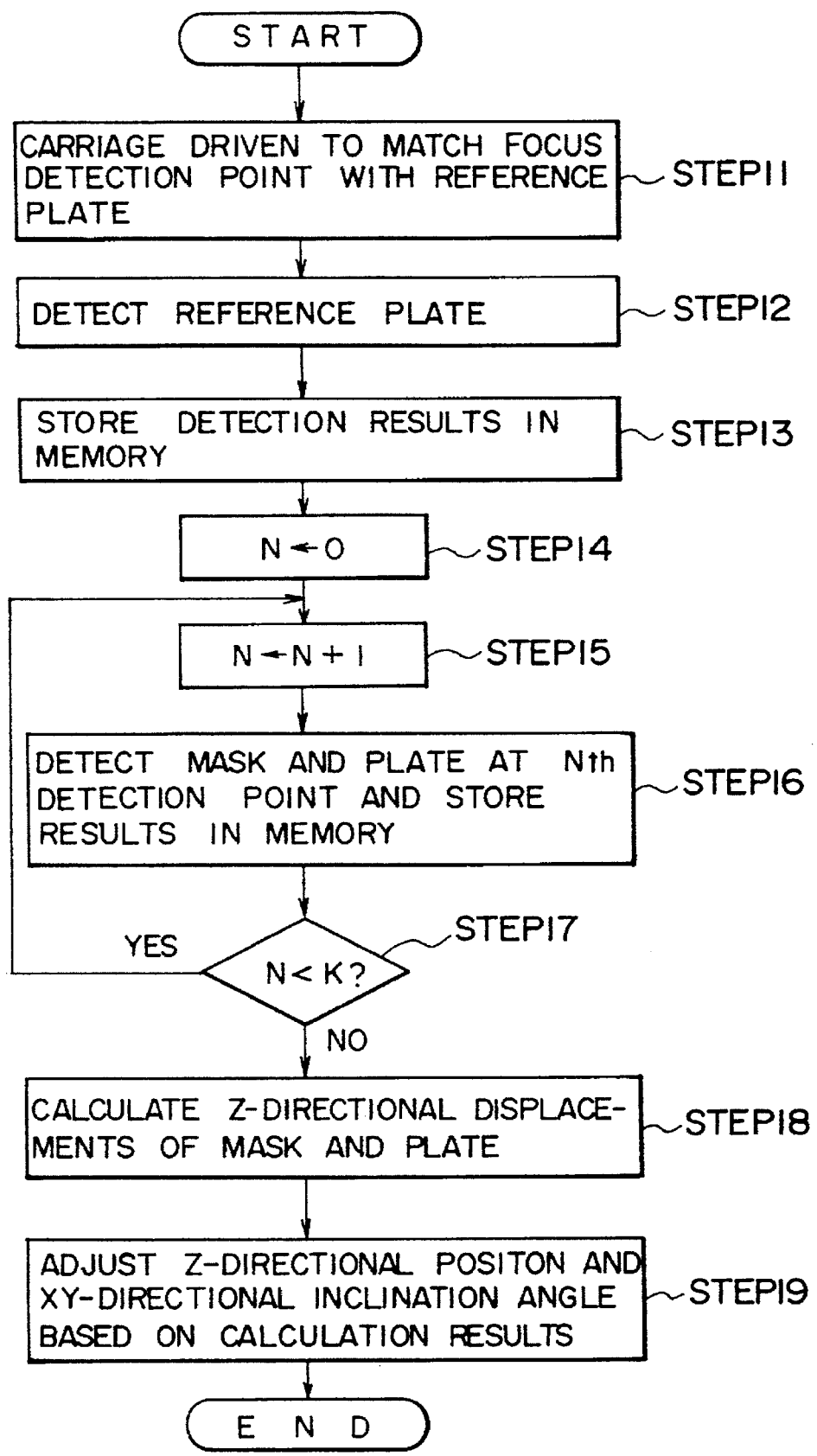
FIG. 14 is a flow chart illustrating the focal point detection operation for the case of an arbitrary number K of detection points.

The case where the number of the detection points along the X direction is K will be described with reference to the flow chart of FIG. 14.

[Step 11]

In order to align the focus detection points with the Z-directional reference plates 216 and 217 in the X direction, the control section 24 drives the carriage 215 along the X direction (scanning direction).

[Step 12]

The control section 24 detects the Z-directional reference plate 216 at the side of the mask 21, and the Z-directional reference plate 217 at the side of the plate 23. Here, based on the positions $Z_{Ma}$ through $Z_{Md}$ of the reflected light from the detection points on the mask 21 to be projected on the sensor 11, and on the positions $Z_{Pa}$ through $Z_{Pd}$ of the reflected light from the detection points on the plate 23, the distances $L_{0a}=Z_{Pa}-Z_{Ma}, \ldots, L_{0d}=Z_{Pd}-Z_{Md}$ between the positions of the reflected light are calculated.

[Step 13]

The control section 24 functions to store the positions $Z_{Ma}$ through $Z_{Md}$ and $Z_{Pa}$ through $Z_{Pd}$ of the reflected light, and the distances $L_{0a}$ through $L_{0d}$ between the positions of the reflected light in the memory.

[Step 14]

The control section 24 assigns 0 to a certain resister in the memory.

[Step 15]

The control section 24 adds 0 to the value of the certain resister in the memory.

[Step 16]

The control section 24 drives the carriage 215 in the X direction, and detects the mask 21 and the plate 23 at an Nth detection point. In other words, positions $Z_{MNa}$ through $Z_{MNd}$ and $Z_{PNa}$ through $Z_{PNd}$ of the reflected light on the sensor 11 are detected. Then, based on the results of this detection, the distances $L_{Na}=Z_{PNa}-Z_{MNa}, \ldots, L_{Nd}=Z_{PNd}-Z_{MNd}$ are calculated, and these $Z_{MNa}$ through $Z_{MNd}$, $Z_{PNa}$ through $Z_{PNd}$ and $L_{Na}$ through $L_{Nd}$ are stored in the memory. At the same time, the Z-directional position of the Nth detection point is detected with an interferometer system, and the resulting propositional information is stored in the memory.

[Step 17]

The control section 24 determines whether the value of the certain register in the memory is smaller than K. Here, if the value of the register is smaller than K, then the control section proceeds to Step 15, or the control section 24 proceeds to the next Step 18 in cases where the value of the register is K or more.

[Step 18]

The control section 24 calculates the Z-directional displacements ΔL of the plate 23 from the Z-directional reference plates 216 and 217 at the side of the mask 21 and at the side of the plate 23, respectively. Here, $L_{Na}-L_{0a}=\Delta L_{Na}, \ldots, L_{Nd}-L_{0d}=\Delta L_{Nd}$.

[Step 19]

The control section 24 adjusts the Z-directional position, angle of inclination in the X direction, and angle of inclination in the Y direction of the plate stage 206 so that all the $\Delta L_{Na}$ through $\Delta L_{Nd}$ become null.

By following the foregoing Steps 11–19, proper alignment of the patterned surface of the mask 21 with the resist-applied surface of the plate 23 is completed for focusing. Thereafter, the control section 24 moves to an exposure operation.

Figure 15:
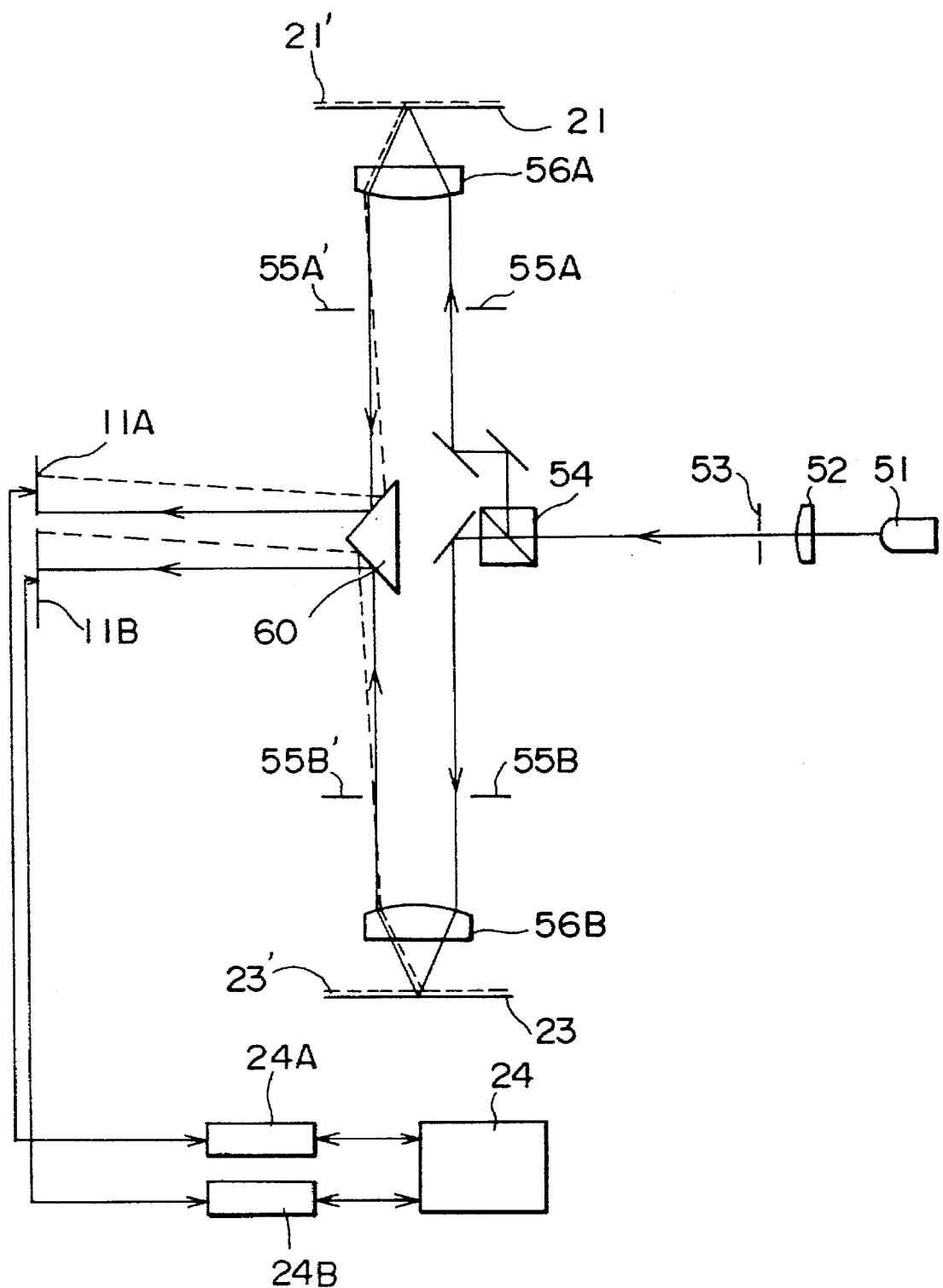
FIG. 15 is a view showing another embodiment of the position detection optical system.

FIG. 15 is a view showing the structure of another position detection optical system. The position detection optical system shown is equipped with one light source 51 such as LEDs. The light leaving the light source 51 strikes a beam splitter 54 via a lens 52 and a visual field slit 53. In turn, the light incident on the beam splitter 54 is divided into reflective beams advancing up in the drawing, and transmitted beams advancing leftward in the drawing.

The reflected beams strike the mask 21 obliquely through an aperture stop 55A and an objective lens 56A with a relatively great aperture. On the other hand, the transmitted beams obliquely strike the plate 23 through an aperture stop 55B and an objective lens 56B with a relatively great aperture.

The beams of light reflected from the mask 21 and the plate 23 strike a prism 60 via respective lenses 56A and 56B, and then via respective aperture stops 55A' and 55B'. The two beams of reflected light incident on the prism 60 are both deflected leftward in the drawing, and fall on respective corresponding two-dimensional sensors (or one-dimensional sensors such as CCDs) 11A and 11B. At the respective sensors 11A and 11B, the positions and the quantities of light of the corresponding beams of reflected light are converted to electric signals.

The size of the signals resulting from conversion at the respective sensors 11A and 11b are determined; if the signal size is outside the proper input range for each of the sensors, then the input gain for each sensor is varied by a gain controller 24A or 24B so that the signal size comes in the proper input range for each sensor. If the sensor is, for example, a CCD, then the change in the input gain may be accomplished by changing its storage time. Further, an algorithm for determining a demand for the input gain at a signal processing section 24 may be constructed by replacing the "demand for light quantity of the light source" by "demand for input gain of the sensor" in the algorithm shown in FIG. 4.

Since the function of the position detection optical system shown in FIG. 15 is the same as the function of the position detection optical system of FIG. 3, description of the former is omitted to avoid overlapping. A notable difference is found, however, in that, as is shown in FIG. 15, as opposed to the case of the position detection optical system of FIG. 3, the movement of the mask 21 and the plate 23 upward in the drawing causes the reflected light-receiving positions of the two-dimensional sensors 11A and 11B to move upward in the drawing.

Additionally, in the foregoing embodiments, if the slit-like beams of light are compressed in its longer direction via a cylindrical lens, and received by a one-dimensional sensor, then the quantity of the light received increases, and therefore an improvement in the S/N ratio and a pattern averaging effect may be expected.

In the foregoing embodiments, the description was made of the cases of using an oblique incidence focus detection optical system as the position detection system, nevertheless, any other suitable position detection means may be used.

Furthermore, although, in the foregoing embodiments, the description was made regarding the cases of using an oblique incidence focus detection optical system as the position detection system, even with an exposure apparatus comprising a non-real-size projection optical system, defocusing of the transferred pattern may be avoided by controlling positioning based on the positional information on the mask and the positional information on the plate so that the distance between the mask and the plate is held at a predetermined distance, or that the position of the mask and the position of the plate are located at predetermined positions.

For example, in the embodiments shown in FIG. 2 and FIG. 3, suppose that the projection optical system 22 is of one Mth scale rate. Regarding a method of detecting the imaging position of the slit image on the two-dimensional sensor 11, in case the magnification of the lens 6A is identical to the magnification of the lens 6B, the only requisite is that positioning of the mask 21 or the plate 23 is controlled so that the migration length of the image of the visual field slit 3A (the image formed by the light via the mask 21) is $M^2$ times the migration length of the image of the visual field slit 3B (the image formed by the light via the mask 23), both formed on the two-dimensional sensor 11.

Alternatively, the lens 6A and the lens 6B may be designed to have different magnifications (e.g., the magnification of the lens 6A' is set to be $1/M^2$ times the magnification of the lens 6B' when the projection optical system is of 1/M magnification) to provide a structure with constant spacing between them on the two-dimensional sensor 11.

The above structure may be employed, without being limited to the case of the projection optical system 22 with a reduction ratio, in cases where the projection optical system 22 involves magnification as well.

In this connection, although the detection in the foregoing embodiments is made for the positional relationship between only two points, one located on the mask 21 and one on the plate 23, the position detection may be performed at a plurality of points along the direction orthogonal to the scanning direction of the mask 21 and the plate 23 in case the sizes of the mask 21 and the plate 23 are very large. In this case, a plurality of position detection systems may be provided, and it is enough to control the position of at least one of the mask 21 and the plate 23 is controlled based on the detection results of these position detection systems.

In addition, instead of the two-dimensional sensor 11 used in each of the foregoing embodiments, a one-dimensional sensor such as CCD mentioned above may be utilized.

Additional embodiments will be given hereunder with reference to FIG. 16 through FIG. 21. A first additional embodiment is for the application of the present invention to a scanning exposure type of projection exposure apparatus equipped with a projection optical system which projects a real-size erect image.

Figure 16:
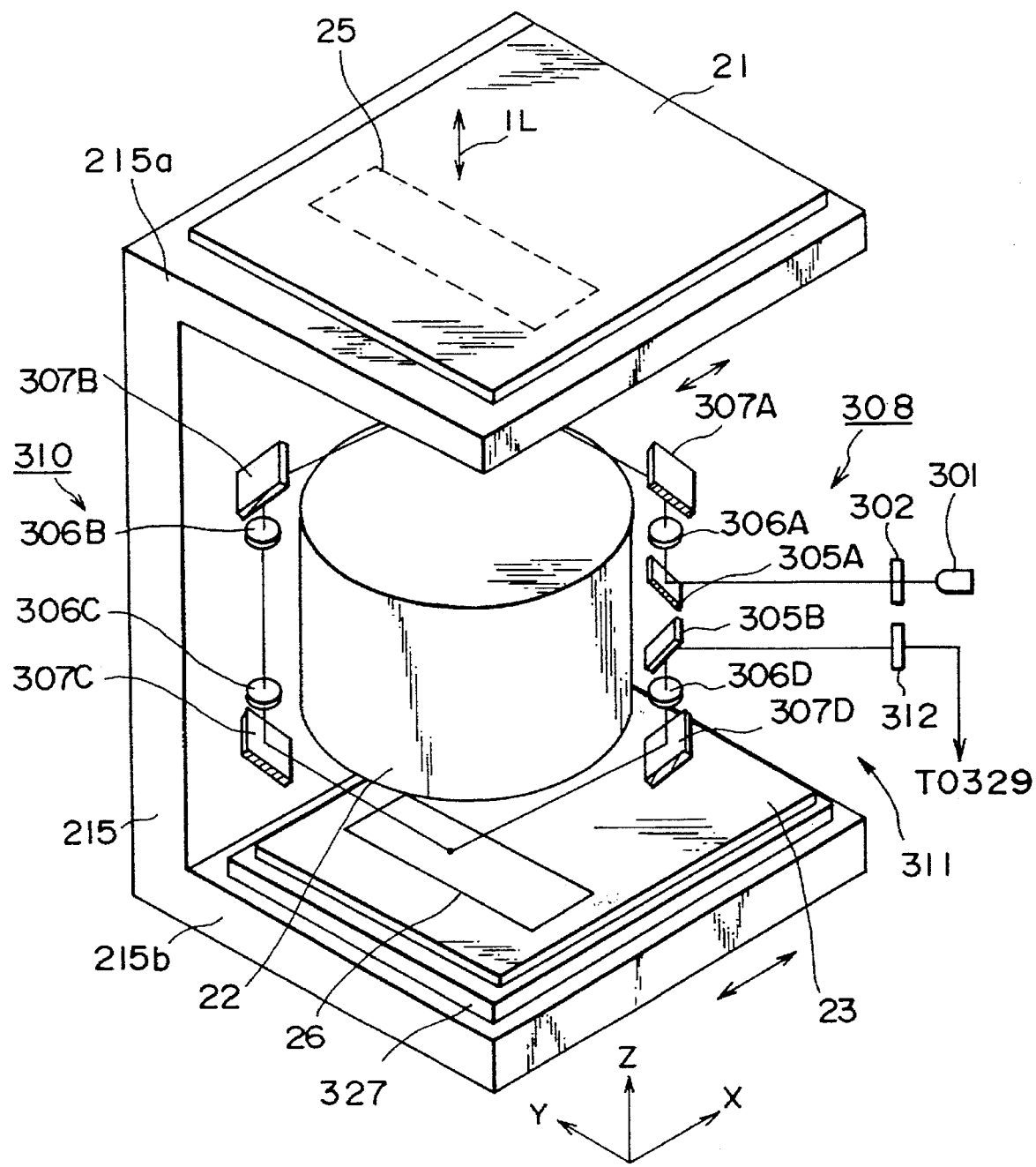
FIG. 16 is a perspective view showing the outside structure of the exposure section of an exposure apparatus according to another embodiment.

FIG. 16 is a view showing the structure of the exposure section of the projection exposure apparatus according to the present embodiment, wherein a mask 21 is held on the upper stage 215a of a C-shaped section carriage 215, while a plate 23 as the substrate to be exposed is held on the lower stage 215b of the carriage 215 via a Z stage 327, and between the mask 21 and the plate 23 is fixed a projection optical system 22 which projects a real-size erect image. The carriage 215 is constructed so that the scanning is performed in the X direction perpendicular to the optical axis (Z axis is defined to be parallel thereto) of the projection optical system 22.

Figure 17:
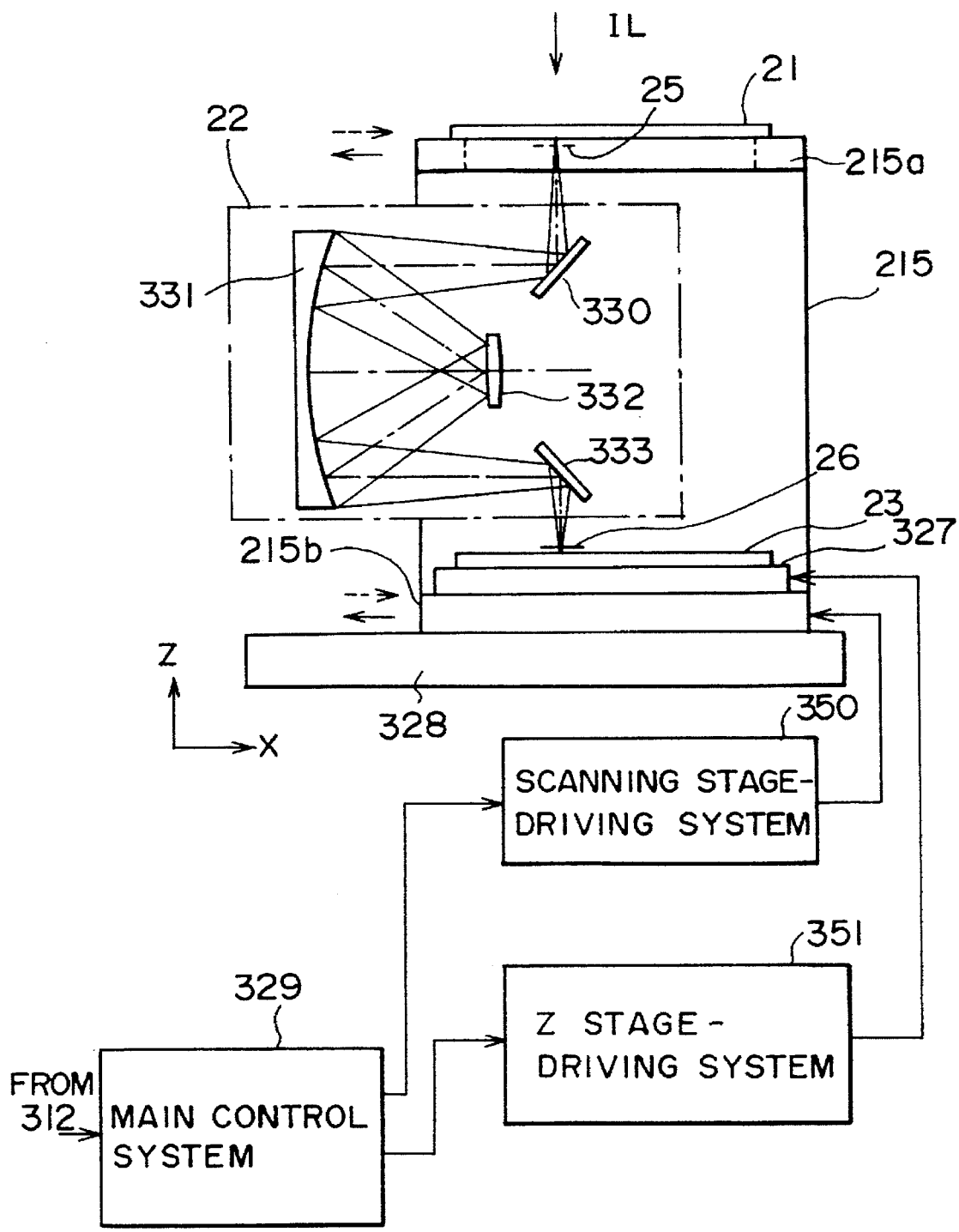
FIG. 17 is a view showing an example of the structure of the projection optical system used in the exposure apparatus of FIG. 16.

FIG. 17 shows an example of the structure of the projection optical system 22 of the present embodiment; in this FIG. 17, the basic structure of the projection optical system 22 comprises a concave mirror 331 and a convex mirror 332, with a configuration that these concave mirror 331 and convex mirror 332 substantially coincide with each other regarding center of curvature. Furthermore, disposed below the mask 21 is a reflecting mirror 330 which deflects the light from the mask 21 toward a concave mirror 331, whereas above the plate 23 there is positioned a reflecting mirror 333 to deflect the light which is reflected from the concave mirror 331 after having traveled between the concave mirror 331 and the convex mirror 332- With this projection optical system 22 an image of the pattern within an illumination area 25 on a reticle R is projected on the exposure area 26 on the plate 23 as a real-size image. This image is reversed in the direction perpendicular to the plane of the sheet of FIG. 17 (Y direction) and is non-inverted left to right (X direction) in the FIG. 17.

On the other hand, a Z stage 327 is a stage of adjustment of the position of a plate 23 in the direction of the optical axis of the projection optical system 22, wherein a main control system 329, which controls the operation of the entire system, controls the Z-directional displacement of the Z stage 327 by means of a Z stage-driving system 351. Furthermore, the carriage 215 is constructed to be capable of moving at a predetermined rate on the base 328 in the +X direction or in the −X direction relative to the projection optical system 22. The main control system 329 controls the scanning direction, scanning rate, etc. of the carriage 215 via the scanning stage-driving system 350.

Returning to FIG. 16, illumination light IL from an illumination optical system (not shown) illuminates the illumination area 25 on the mask 21 with a uniform illumination distribution. The illumination area 25 is formed as a slit (like a rectangle or an arc) with its shorter direction along the X direction and its longer direction along the Y direction perpendicular to the X direction. The exposure area 26 is of the same configuration as the illumination area 25.

Here, scanning of the mask 21, the plate 23 and the Z stage 327 in a body in the +X direction or in the −X direction via the carriage 215 causes the pattern on the mask to be exposed on the plate 23 in a scanning exposure manner.

Next, the structure of the focus detection optical system according to the present embodiment will be described.

Figure 18:
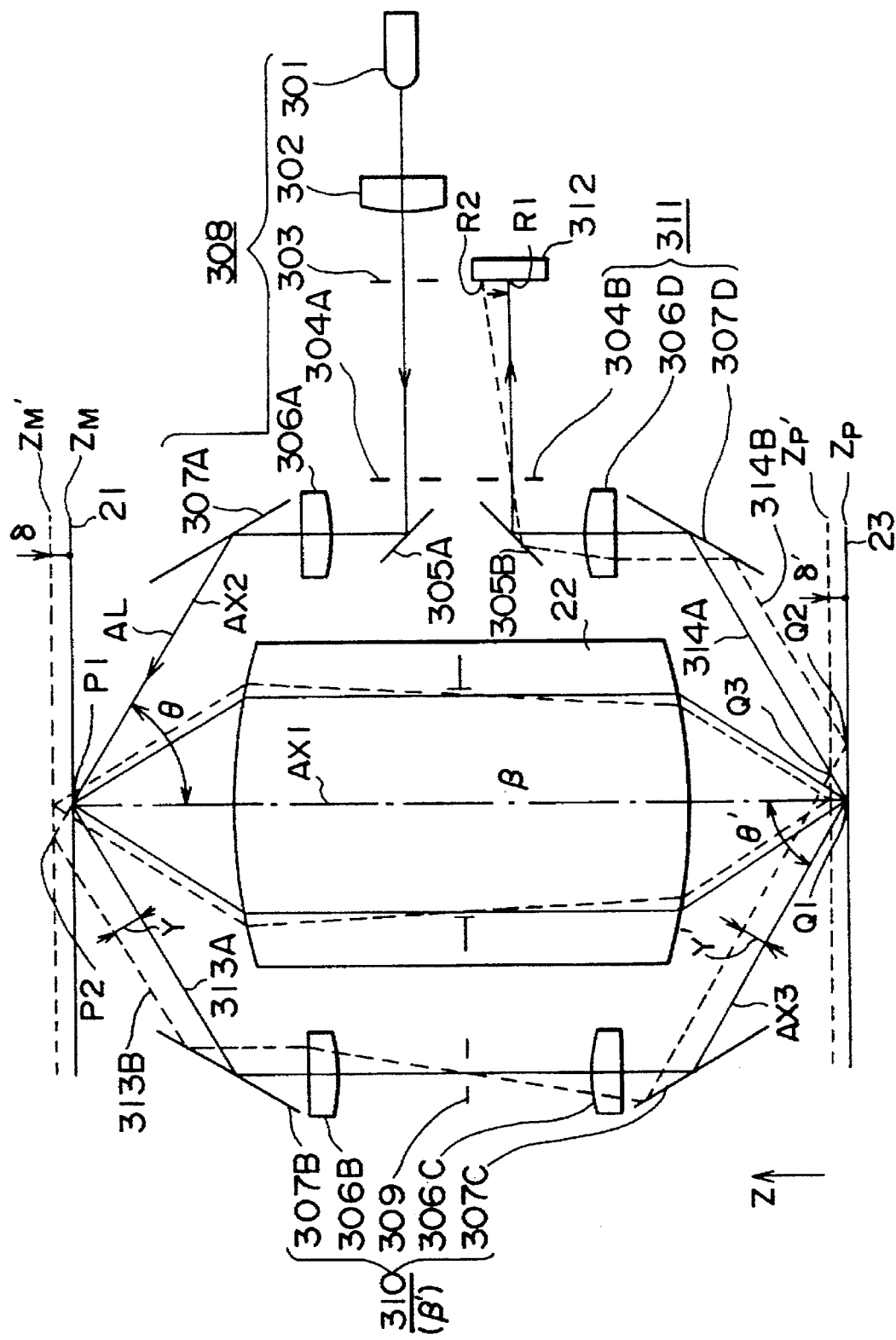
FIG. 18 is a view showing the structure of the focal point detection optical system of the exposure apparatus shown in FIG. 16.

FIG. 18 shows the structure of an oblique incidence type of focus detection optical system according to the present embodiment; in FIG. 18 the focus detection optical system comprises a projection optical system 308, a relay optical system 310, a reimaging optical system 311 and a two-dimensional image sensor 312 composed of a two-dimensional CCD, etc. First, with the projection optical system 308, beams emitted from, e.g., a light source 301 such as an LED (preferably in a wavelength band poorly photosensitizing the photoresist on the plate 23) illuminate a visual field slit 303 through a condensing lens 302. The visual field slit 303 has a slit pattern with its lengthwise direction perpendicular to the plane of the sheet of FIG. 18, and the beams passing through this slit advance via an aperture stop 304A, a mirror 305A, and an objective lens 306A to fall on a mirror 307A, and the beams reflected from the mirror 307A in turn strike the mask 21 (more exactly the surface this pattern is formed thereon) obliquely to project the image of the slit pattern on the mask 21. In conclusion, the visual field slit 303 and the mask 21 are substantially in a conjugate relationship.

Here, suppose that the exposure surface of the plate 23 conjugates with the patterned surface of the mask 21 in case the exposure surface of the plate 23 is located at a position $Z_p$ on the assumption that the patterned surface of the mask 21 is located at a position $Z_M$ in the Z direction. In this case, the light AL advancing along the optical axis AX2 of the projection optical system 308, after having been reflected from a point P1 on the mask 21, moves toward a both-side telecentric relay optical system 310 along a trace 313 A (supposing that this coincides with the optical axis of the relay optical system 310) indicated by a solid line.

With the relay optical system 310, the reflected light from the mask 21 strikes the aperture stop 309 through a mirror 307B and a first relay lens 306B, and the beams which have passed the aperture of the aperture stop 309 obliquely falls on the exposure surface of the plate 23 located at a position $Z_p$, via a second relay lens 306C and a mirror 307C, thereby reforming the image of the slit pattern formed on the plate 23. That is, with respect to the relay optical system 310, the mask 21 and the plate 23 are in a substantially conjugate relationship. The light which has hit the relay optical system 310 along the trace 313A strikes a point Q1 on the plate 23 along the optical axis AX3 of the relay optical system at the side of the plate 23, and the light reflected from the point Q1 then travels along a trace 314A indicated by a solid line to hit a reimaging optical system 311.

With this reimaging optical system 311, the reflected light from the plate 23 moves via a mirror 307D, a photoreceptive lens 306D and a mirror 305B to hit an aperture stop 304B, and the beams which have passed the aperture stop 304B reforms the image of the slit pattern at a point R1 on the photoreceptive surface of the two-dimensional image sensor 312. That is, relating to the reimaging optical system 311, the plate 23 and the two-dimensional image sensor 312 is substantially in a conjugate relationship, and the lengthwise direction of the image of the slit pattern formed on the two-dimensional image sensor 312 is perpendicular to the plane of the sheet of FIG. 18. Pixel signals of the two-dimensional image sensor 312 is fed to the main control system 329 of FIG. 17, and the main control system 329 calculates the position of the reformed image based on the fed pixel signals, and adjusts the Z-directional height of the Z stage 327 via a Z stage-driving system 351 so that the calculated position aligns with a predetermined position.

Returning to FIG. 18, in case the plate 23 is displaced in the Z direction parallel to the optical axis AX1 of the projection optical system 22, the imaging point of the slit pattern on the two-dimensional image sensor 312 is displaced laterally, or upward or downward in the drawing, in the same manner as according to the prior art. Furthermore, think of it: in this embodiment, supposing that the plate 23 locates at a position $Z_p$, the mask 21 displaces, e.g., a length δ in the Z direction and reaches a position $Z_m'$. In this case, the light AL from the projection optical system 308 is reflected from a point P2 on the mask 21, after which it advances along the trace 313B indicated by a dotted line to hit the relay optical system 310, and then a point Q2 on the plate 23. Since the reflected light from this point Q2 strikes the reimaging optical system 311 along a trace 314B indicated by a dotted line, an image of the slit pattern is reformed at a point R2 which is laterally displaced from the original point R1, on the two-dimensional image sensor 312. Accordingly, even in the case of a Z-directional displacement of the mask 21, since the imaging position on the two-dimensional image sensor 312 is displaced laterally, the imaging position suggests the relative positional relationship between the mask 21 and the plate 23.

As an example, according to the present embodiment the Z-directional height of the plate 23 is adjusted so that the imaging position on the two-dimensional image sensor 312 always matches the original point R1. The requisite for accomplishing this purpose is only that the imaging point on the two-dimensional image sensor 312 be controlled to return to the original point R1 in response to the movement of the plate 23 to a position conjugate with the mask 21 which has undergone a Z-directional displacement δ. Hereunder conditions for accomplishing the above purpose will be discussed.

In the present embodiment, the magnification of the projection optical system 22 is real-size (1X magnification), however, since the mentioned below may be applied regardless of the magnification, a description will be made on the assumption that the magnification of the projection optical system 22 from the mask 21 to the plate 23 is β.

First, suppose that the mask 21 is displaced by δ (the upward direction is indicated by +) from a position $Z_M$ to a position $Z_M'$. In this case, the conjugate relationship between the mask 21 and the plate 23 is maintained if the plate 23 is displaced δ·β² (referred to as δ') from a position $Z_p$ to a position $Z_p'$ correspondingly. Also relating to δ', the upward direction is indicated by +. In addition, if the magnification (lateral magnification) of the relay optical system 310 from the mask 21 to the plate 23 is β', the angle between the optical axis AX2 of an oblique incidence type of projection optical system 308 and the normal to the mask 21 (which matches the optical axis AX1 of the projection optical system 22 in the present embodiment) (angle of incidence) is θ, and the angle between the optical axis AX3 of the relay optical system 310 at the side of the plate 23 and the normal to the plate 23 (angle of incidence) is θ', then the lateral displacement from the side of the mask 21 relative to the relay optical system 310, or the lateral displacement Y from the trace 313A to the trace 313B may be expressed as follows:

$$Y = 2\delta \sin\theta \quad (1)$$

Further, on the plate 23, there is observed a lateral displacement Y of beams from the relay optical system 310 which is determined by the following equation:

$$Y' = \beta' \cdot Y = 2\beta' \delta \sin\theta \quad (2)$$

Here, in order to move the imaging point on the two-dimensional image sensor 312 back to the original point R1, it is necessary only that the intersection Q3 of the light proceeding to the plate 23 along the trace 313B via the relay optical system 310 and the place 23 displaced to the position $Z_p'$ comes on the first trace 314A of the reflected light. To meet this requirement, the lateral displacement Y' defined by Equation (2) is made identical to 2δ' sinθ'. In other words, only a requisite is that the following equation is held.

$$2\delta' \sin\theta' = 2\beta' \delta \sin\theta' \quad (3)$$

By rearranging the above equation by substitution of δ'=δ·β², the following equation is established.

$$\beta^2 = \beta' \cdot \sin\theta / \sin\theta' \quad (4)$$

That is, β'=(sinθ'/sinθ)β²'. If this equation holds with an accuracy on the order of 10%, then even with a Z-directional displacement δ of the mask 21, the corresponding Z-directional displacement δ' of the plate 23 serves to maintain the conjugate relationship between the plate 23 and the mask with respect to the projection optical system 22, and further to move the point on the two-dimensional image sensor 312 for forming an image of the slit pattern back to the original R1.

Figure 19A:
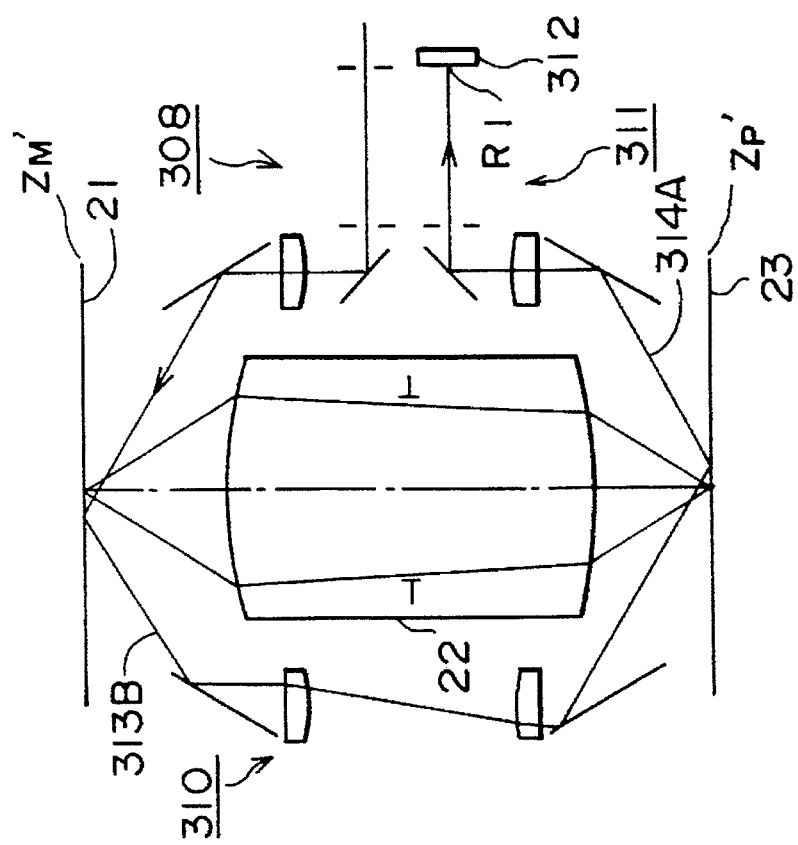
FIG. 19A and FIG. 19B are views illustrating the change of optical paths of the position detection optical system for the displacement δ of the mask.
Figure 19B:
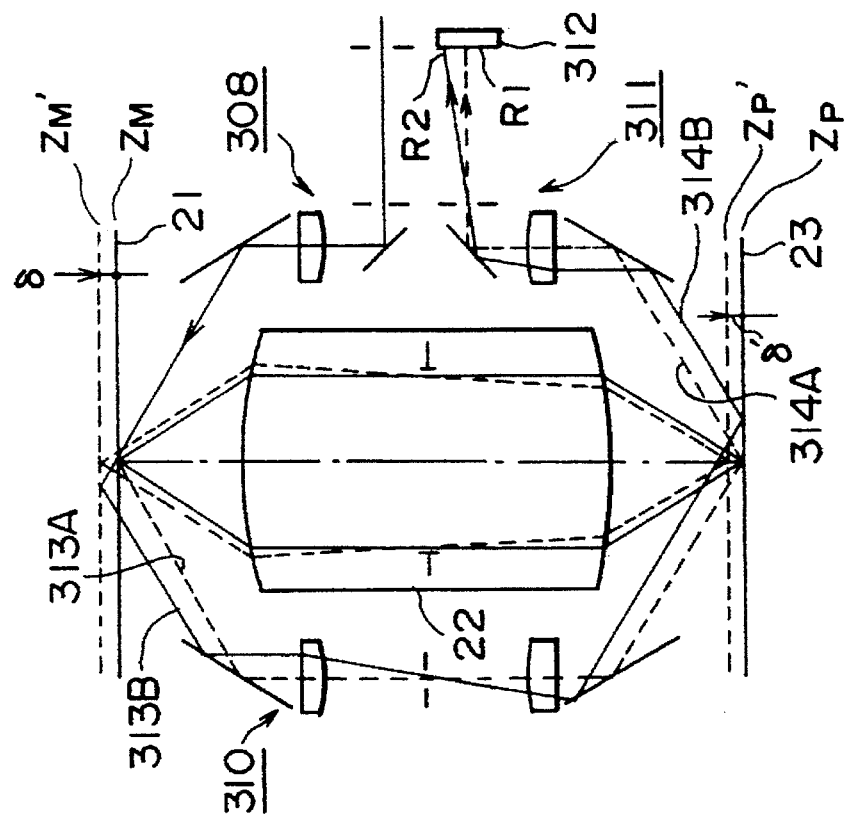

In other words, if the position of the mask 21 is displaced δ, as is shown in FIG. 19A, to move the imaging point on the two-dimensional image sensor 312 to a point R2, then, it is necessary only to control so that the displacement of the plate 23 in the direction of the optical axis of the projection optical system 22 allows the imaging point on the two-dimensional image sensor 312 to return to the point R1. This control serves to maintain the conjugate relationship between the mask 21 and the plate 23 with respect to the projection optical system 22, and consequently allows the exposure to be performed always in a focused state.

Furthermore, since the relay optical system 310 is both-side telecentric, even with Z-directional displacements of the mask 21 and the plate 23, Equation (4) is always held to allow proper focusing.

In addition, in FIG. 18, in case the projection optical system 22 is of a real-size magnification (β=1), then δ=δ', for which reason the above control means that the distance between the mask 21 and the plate 23 is held constant.

Returning to FIG. 16, according to the present embodiment, in a direction intersecting the X direction, or the scanning direction, at an angle of about 45° there is arranged an oblique incidence type of focus detection optical system comprising a projection optical system 308, a relay optical system 310, a reimaging optical system 311 and a two-dimensional image sensor 312. This arrangement serves to compact the entire apparatus.

Then, by scanning the mask 21 and the plate 23 in the X direction via the carriage 215 while controlling the height of the plate 23 via the Z stage 327 so that the imaging point on the two-dimensional image sensor 312 aligns with a predetermined point, the pattern of the mask 21 is exposed on the plate 23 in a scanning exposure manner. Here, it is noted that exposure is always performed in focus regardless of whether the mask is partially bent, or the mask is attached inclined.

Figure 20:
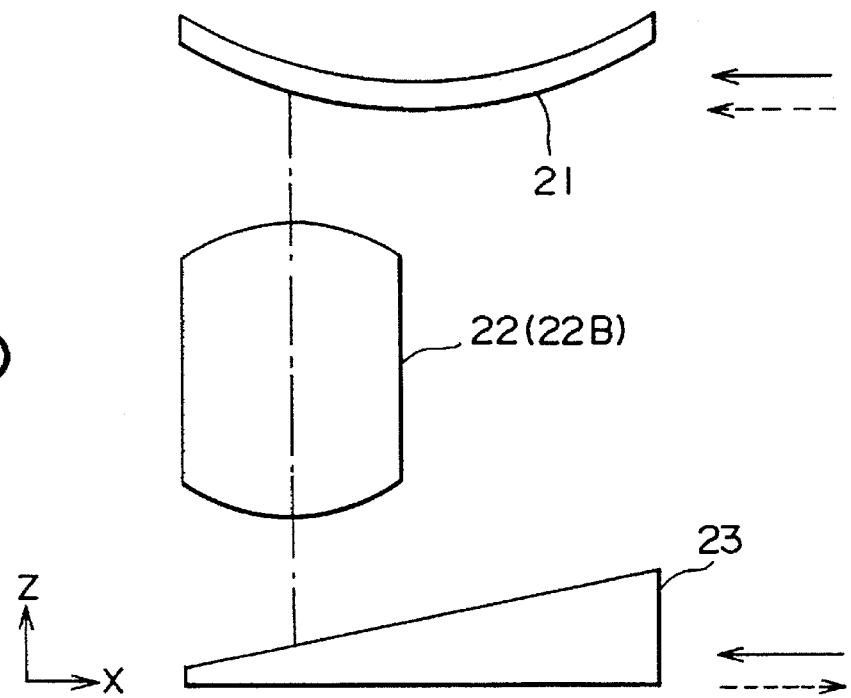
FIG. 20 and 21 are views showing an operation for adjustment of the position of the focus for the case of increased bending of the mask and increased inclination of the plate.

Next, as is shown in FIG. 20 exaggeratedly, if much time is required to detect defocusing because of too great bending of the mask 21 and too great inclination of the plate 23, there may be some cases where the operation for adjustment of the height of the plate 23 to its proper level cannot be followed during scanning exposure of the mask 21 and the plate 23 in the direction indicated by a solid line. Against such cases, it is possible to perform prescanning in an exposure-free condition with the focus detection optical system of FIG. 18 at, e.g., a low speed beforehand in the same manner as the above, and information is stored in the memory which relates to the Z directional position of the plate 23 relative to its X directional position, in order to maintain the conjugate relationship between the mask 21 and the plate 23. Then, when actually exposed, only with control successively transferred to the Z-directional positions of the plate 23 stored in the memory relative to its X-directional positions, exposure may be carried out in focus over the entire range of scanning. In this connection, although the scanning directions for the mask 21 and the plate 23 indicated by dotted lines in FIG. 20 are opposite to each other, this reflects only the fact that in this case a projection optical system 22B which projects an inverted image is used instead of the projection optical system 22.

Figure 21:
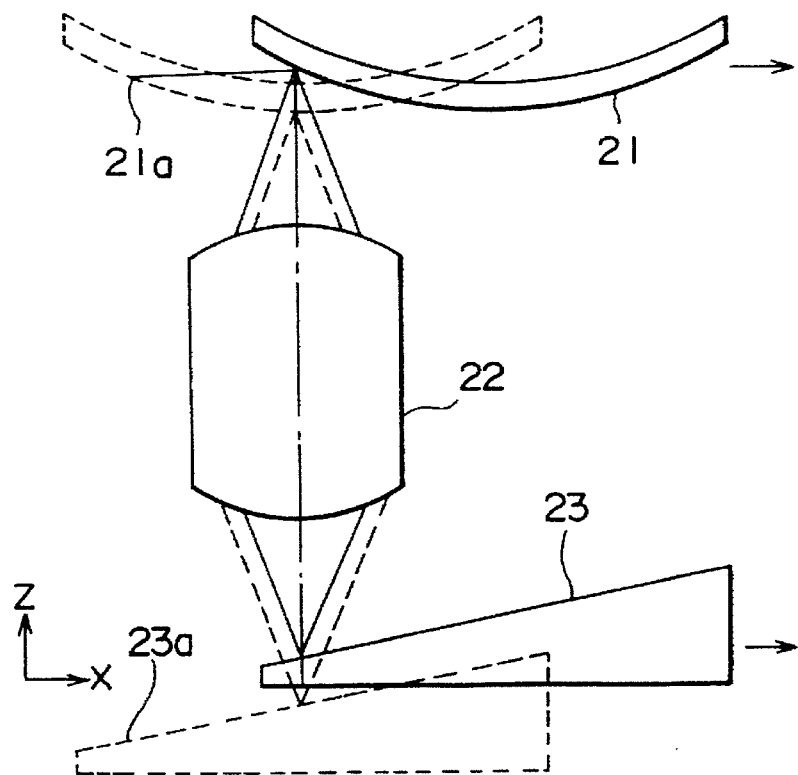

In addition, the positional relationship between the mask 21 and the plate 23 may be subjected to look-ahead in a field upstream from the exposure field of the projection optical system 22, and then focusing may be performed based on the resulting look-ahead information. Here, defining the scanning direction as the +X direction as is shown in FIG. 21, upstream from the exposure field of the projection optical system 22 the positional relationship between a point 21a on the mask 21 and a point 23a on the plate 23, for example, is detected, and when the points 21a and 23a have reached points of exposure the height of the plate 23 is controlled based on the look-ahead information. This control substantially allows real time focusing.

Additionally, the embodiments of FIG. 20 and FIG. 21 show the operation for the cases of focusing in the scanning direction, where, practically in the embodiment of FIG. 16, because of poor parallelism between the mask 21 and the plate 23 in the direction (Y direction) perpendicular to the scanning direction (X direction), there is a possibility of partial Y-directional defocusing. In order to prevent occurrence of defocusing in the direction perpendicular to the scanning direction, plural sets of oblique incidence types of focus detection optical system may be arranged in the Y direction in FIG. 16 to detect the positional relationship between the mask 21 and the plate 23. In this case, however, the Y-directional defocusing may be avoided by disposing a leveling stage capable of adjusting the inclined condition of the plate 23 in addition to the Z stage 327, and adjusting the angle of the Y-directional inclination of the plate 23 at this leveling stage.

Additionally, regarding the foregoing embodiments, although detection is performed with the two-dimensional image sensor 312 of FIG. 18, the two-dimensional image sensor 312 may be replaced by, e.g., a photoreceptive slit and a photodetector, and the mirror 305B may be replaced by an oscillatory type of mirror to provide the structure of a photoelectric microscope for the detection of the reformed image. Separately, the two-dimensional image sensor 312 may be replaced by a one-dimensional image sensor with photoreceptive pixels arranged along the plane of the sheet of FIG. 18.

Furthermore, although the focusing is performed by adjustment of the Z-directional position of the plate 23 in the above embodiments, the focusing may be accomplished by adjustment of the Z-directional position of the mask 21, or by adjustment of the Z-directional positions of both the mask 21 and the plate 23. Furthermore, the magnification of the projection optical system 22 is not required to be of real-size, and may be either enlarging or reducing type, and an inverted image-projecting type of projection optical system may be used as well.

Figure 22:
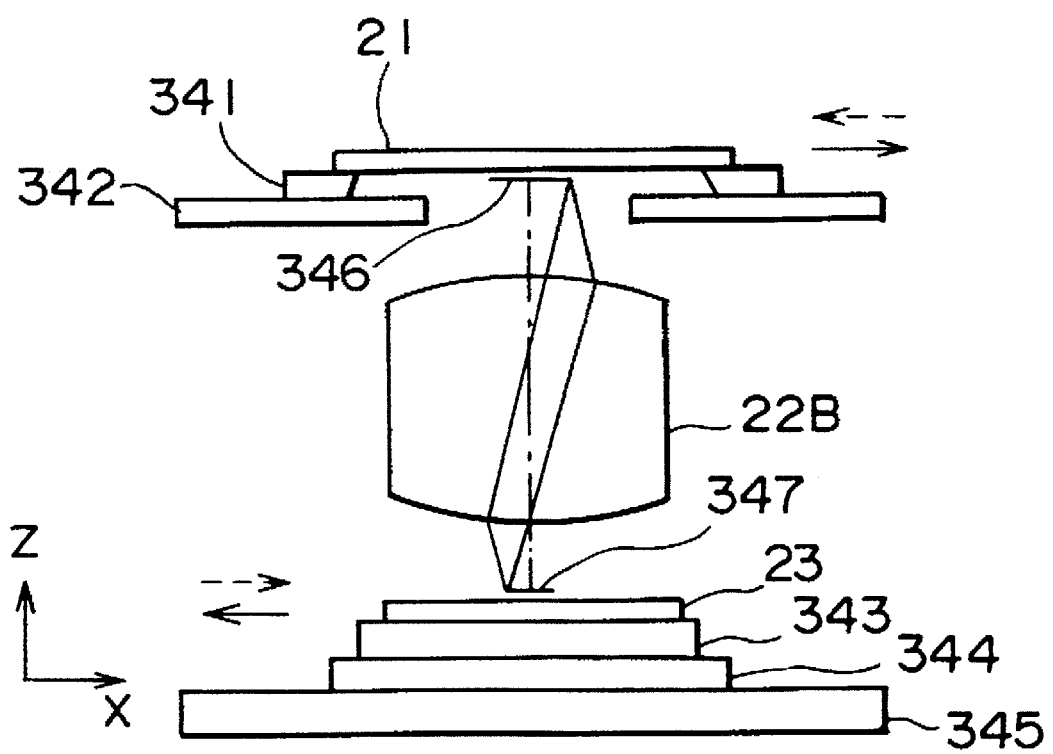
FIG. 22 is a view illustrating the case of using a projection optical system which forms inverted images.

FIG. 22 shows a case where a projection optical system 22B of a magnification $\beta$ which forms an inverted image is used as the projection optical system. In FIG. 22, the mask 21 is mounted on a mask stage 341, and this mask stage 341 is supported on a mask base 342 in a freely movable manner in the X direction. On the other hand, the plate 23 is mounted on an XY stage 344 via a Z stage 343, and the XY stage 344 is constructed in a freely movable manner in the X direction and in the Y direction. During scanning exposure, synchronized with scanning of the mask 21 at a velocity $V_R$ in the +X direction or in the -X direction relative to the slit-like illumination area 346, the plate 23 is scanned at a velocity $V_W (=\beta \cdot V_R)$ in the -X direction or the +X direction relative to the exposure area 347 conjugate with the illumination area 346 to expose the pattern of the mask 21 on the plane 23.

The foregoing embodiments are examples of application of the present invention to scanning exposure types of projection optical system, and needless to say the present invention may be applied to one-shot exposure types of projection optical system including a stepper. In the case of one-shot exposure type, defocusing may be detected with the focus detection optical system of FIG. 18, and based on the results of the detection the Z-directional position of the mask 21 or the plate 23 is adjusted, after which the pattern of the mask 21 is exposed on the plate 23.

As mentioned above, without being limited to the foregoing embodiments the present invention may by constructed in various ways without departing from the essential characteristics of the present invention.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 5-339769 filed on Dec. 6, 1993; 6-057087 filed on Mar. 28, 1994; and 6-124597 filed on May 13, 1994 are hereby incorporated by reference.

What is claimed is:

1. An exposure apparatus for performing projection exposure of the pattern formed on a first substrate supported on a first stage onto a second substrate supported on a second stage, comprising:

a real-size and both-side telecentric projection optical system said projection exposure is performed therethrough;

position detection means for detecting the positions of said first and second substrates in the direction of the optical axis of said projection optical system; and positioning control means for keeping constant the distance between said first and second substrates by positioning at least one of said first and second stages based on the positional information obtained through detection with said position detection means, wherein said position detection means comprises light incidence means for oblique incidence of beams of light on said first and second substrates, and photoreceptive means for receiving the reflected light from said first and second substrates; and said positioning control means positions at least one of said first and second stages based on the positions where the reflected light from said first and second substrates are received.

2. An exposure apparatus according to claim 1, wherein said light incidence means comprises first light incidence means for oblique incidence of beams of light on said first substrate, and second light incidence means for oblique incidence of beams of light on said second substrate.

3. An exposure apparatus according to claim 2, further comprising light quantity control means for controlling the quantity of the light emitted from said first and second light incidence means, based on the quantity of the light reflected from said first and second substrates.

4. An exposure apparatus according to claim 1, wherein said photoreceptive means comprises first photoreceptive means for receiving the reflected light from said first substrate, and second photoreceptive means for receiving the reflected light from said second substrate; and further comprising sensitivity control means for controlling the sensitivity of said first and second photoreceptive means.

5. An exposure apparatus according to claim 1, wherein said positioning control means controls the position of at least one of said first and second stages, based on the distance between the point for receiving the reflected light from said first substrate and the point for receiving the reflected light from said second substrate.

6. An exposure apparatus according to claim 1, wherein said positioning control means controls the positions of said first and second substrates, based on the positions the reflected light from said first and second substrates is received thereat.

7. An exposure apparatus for performing projection exposure os the pattern formed on a first substrate supported on a first stage onto a second substrate supported on a second stage while scanning said first and second substrates, comprising:

a real-size and both-side telecentric projection optical system said projection exposure is performed therethrough, said scanning being performed in the direction perpendicular to the optical axis of said projection optical system;

position detection means for detecting the position of said first and second substrates in the direction of the optical axis of said projection optical system; and positioning control means for keeping constant the distance between said first and second stages based on the positional information obtained through detection with said position detection means, wherein said position detection means detects the positions of said first and second substrates at a plurality of the scanning points during prescanning in a non-exposure condition; and said positioning control means controls the position of at least one of said first and second substrates, based on the positional information from said position detection means at said plurality of scanning points to keep constant the distance between said first and second substrates over the range of scanning.

8. An exposure apparatus according to claim 7, wherein said position detection means detects the positions of said first and second substrates over substantially the entire surfaces thereof.

9. An exposure apparatus for performing scaled-up projection exposure of the pattern formed on a first substrate supported on a first stage onto a second substrate supported on a second stage, comprising:

a both-side telecentric projection optical system said projection exposure is performed therethrough;

position detection means for independently detecting each of the positions of said first and second substrates in the direction of the optical axis of said projection optical system; and positioning control means for controlling the position of at least one of said first and second stages, based on the positional information obtained through detection with said position detection means.

10. An exposure apparatus for performing scaled-down projection exposure of the pattern formed on a first substrate supported on a first stage onto a second substrate supported on a second stage, comprising:

a both-side telecentric projection optical system said projection exposure is performed therethrough;

position detection means for independently detecting each of the positions of said first and second substrates in the direction of the optical axis of said projection optical system; and positioning control means for controlling the position of at least one of said first and second stages, based on the positional information obtained through detection with said position detection means.

11. An exposure method for performing projection exposure of the pattern formed on a first substrate supported on a first stage onto a second substrate supported on a second stage through an real-size, both-side telecentric projection optical system, while scanning said first and second substrates relative to said projection optical system in a direction perpendicular to the direction of the optical axis of said projection optical system, comprising:

detecting the positions of said first and second substrates at a plurality of scanning points in the direction of the optical axis of said projection optical system with a position detection means, in a non-exposure condition; and controlling the position of at least one of said first and second stages in the direction of the optical axis of said projection optical system, based on the positional information obtained through detection with said position detection means, thereby performing projection exposure of the pattern formed on said first substrate onto a second substrate while keeping constant the distance between said first and second substrates.

12. An exposure apparatus for performing projection exposure of the pattern formed on a first substrate supported on a first stage onto a second substrate supported on a second stage, comprising:

a both-side telecentric projection optical system said projection exposure is performed therethrough;

an incidence optical system for oblique incidence of beams of light on the surface of a light incidence substrate which is one of said first and second substrates;

a relay optical system for condensing beams of the light reflected from the surface of said light incidence substrate and for incidence of the beams on the surface of a light-leaving substrate which is the rest of said first and second substrates;

a reimaging optical system for condensing beams of the light reflected from the surface of said light-leaving substrate to reform the image;

an image position detection means for detecting the position of the reformed image; and a position adjusting means for adjusting the position of at least one of said first and second stages in the direction of the optical axis of said projection optical system so that the position of the image detected by said image position detection mean is constant.

13. An exposure apparatus according to claim 12, wherein the following relationship is satisfied:

$$0.9 \cdot (\sin\theta'/\sin\theta) \, \beta^2 \leq \beta' \leq 1.1 \cdot (\sin\theta'/\sin\theta) \, \beta^2,$$

here, $\theta$ is the angle between the optical axis of beams of light incident on said light incidence substrate and the normal to the surface of said light incidence substrate, $\theta'$ is the angle between the optical axis of beams of light incident on said light-leaving substrate and the normal to the surface of said light-leaving substrate, $\beta$ is the projection magnification of said projection optical system from said light incidence substrate to said light-leaving substrate, $\beta'$ is the projection magnification of said relay optical system from said light incidence substrate to said light-leaving substrate.

14. An exposure apparatus according to claim 12, wherein said relay optical system is both-side telecentric.

15. An exposure apparatus for performing projection exposure of the pattern formed on a first substrate supported on a first stage onto a second substrate supported on a second stage, comprising:

a real-size and both-side telecentric projection optical system said projection exposure is performed therethrough;

position detection means for detecting the positions of said first and second substrates in the direction of the optical axis of said projection optical system; and positioning control means for keeping constant the distance between said first and second substrates by positioning at least one of said first and second stages based on the positional information obtained through detection with said position detection means, wherein said position detection means detects each of the positions of said first and second substrates independently.

16. An exposure apparatus according to claim 15, wherein said position detection means comprises light incidence means for oblique incidence of beams of light on said first and second substrates, and photoreceptive means for receiving the reflected light from said first and second substrates; and said positioning control means positions at least one of said first and second stages based on the positions where the reflected light from said first and second substrates are received.

17. An exposure apparatus according to claim 16, wherein said light incidence means comprises first light incidence means for oblique incidence of beams of light on said first substrate, and second light incidence means for oblique incidence of beams of light on said second substrate.

18. An exposure apparatus according to claim 17, further comprising light quantity control means for controlling the quantity of the light emitted from said first and second light incidence means, based on the quantity of the light reflected from said first and second substrates.

19. An exposure apparatus according to claim 16, wherein said photoreceptive means comprises first photoreceptive means for receiving the reflected light from said first substrate, and second photoreceptive means for receiving the reflected light from said second substrate; and further comprising sensitivity control means for controlling the sensitivity of said first and second photoreceptive means.

20. An exposure apparatus according to claim 16, wherein said positioning control means controls the position of at least one of said first and second stages, based on the distance between the point for receiving the reflected light from said first substrate and the point for receiving the reflected light from said second substrate.

21. An exposure apparatus according to claim 16, wherein said positioning control means controls the positions of said first and second substrates, based on the positions where the reflected light from said first and second substrates is received.

22. An exposure apparatus according to claim 15 for performing projection exposure while scanning said first and second substrates in the direction perpendicular to the optical axis of said projection optical system,
    wherein said position detection means detects the positions of said first and second substrates at a plurality of the scanning points during prescanning in a non-exposure condition; and
    said positioning control means controls the position of at least one of said first and second substrates, based on the positional information from said position detection means at said plurality of scanning points to keep constant the distance between said first and second substrates over the range of scanning.

23. An exposure apparatus according to claim 22, wherein said position detection means detects the positions of said first and second substrates over substantially the entire surfaces thereof.

24. An exposure apparatus for performing projection exposure of the pattern formed on a first substrate supported on a first stage onto a second substrate supported on a second stage, comprising:
    a both-side telecentric and real-size projection optical system;
    an incidence optical system for oblique incidence of beams on the surface of one of said first and second substrates, said incidence optical system having an optical axis which is slanting with respect to the optical axis of said projection optical system;
    a relay optical system for oblique incidence of beams on the surface of the rest of said first and second substrates, said relay optical system being arranged at a position where the beams reflected from the surface of said one of the substrates are received;
    a reimaging optical system, arranged at a position where the beams reflected from the surface of said rest of the substrates are received, for condensing said beams;
    a detector arranged at a position where a light spot formed by said reimaging optical system is formed; and
    a unit, connected with said detector and with at least one of said first and second stages, for adjusting the position of at least one of said first and second stages in the direction of the optical axis of said projection optical system so that the position of the light spot formed on said detector is constant.

25. An exposure apparatus for performing projection exposure of the pattern formed on a first substrate supported on a first stage onto a second substrate supported on a second stage, comprising:
    a both-side telecentric and real-size projection optical system;
    an incidence optical system for oblique incidence of beams on the surface of said first and second substrates, said incidence optical system having an optical axis which is slanting with respect to the optical axis of said projection optical system;
    a photoreceptive optical system, arranged at a position where the beams reflected from the surface of said first and second substrates are received, for guiding said reflected beams onto said detector; and
    a unit, connected with said detector, for positioning at least one of said first and second stages based an the position of said beams guided onto said detector so that the distance between said first and second substrates is constant.

26. An exposure apparatus according to claim 25, wherein said incidence optical system comprises:
    a first incidence optical system, having an optical axis which is slanting with respect to the optical axis of said projection optical system, for oblique incidence of beams on the surface of said first substrate; and
    a second incidence optical system, having an optical axis which is slanting with respect to the optical axis of said projection optical system, for oblique incidence of beams on the surface of said second substrate;
    and wherein said photoreceptive optical system comprises:
    a first photoreceptive optical system arranged at a position where the beams reflected from said first substrate are received; and
    a second photoreceptive optical system arranged at a position where the beams reflected from said second substrate are received.

27. An exposure apparatus according to claim 26, wherein said photoreceptive optical system is arranged so that beams which pass through said first photoreceptive optical system after reflected from said first substrate and beams which pass through said second photoreceptive optical system after reflected from said second substrate may be guided onto the same detector.

28. An exposure apparatus according to claim 25, wherein said incidence optical system comprises:
    a first incidence optical system for oblique incidence of beams on the surface of one of said first and second substrates, said first incidence optical system having an optical axis which is slanting with respect to the optical axis of said projection optical system; and a relay optical system, arranged at a position where the beams reflected from the surface of said one of the substrates are received, for obliquely guiding said reflected beams onto the surface of the rest of said first and second substrates;

and wherein said photoreceptive optical system, arranged at a position where the beams reflected from the surface of said rest of the substrates are received, for guiding said beams reflected from the surface of said rest of the substrates onto said detector.

29. An exposure apparatus according to claim 28, wherein said unit positions at least one of said first and second stages so that the position of the beams guided onto said detector is constant.

* * * * *